(12) United States Patent
Zhao et al.

(10) Patent No.: US 11,556,681 B2
(45) Date of Patent: Jan. 17, 2023

(54) METHOD AND SYSTEM FOR SIMULATING MOVABLE OBJECT STATES

(71) Applicant: SZ DJI TECHNOLOGY CO., LTD., Shenzhen (CN)

(72) Inventors: Kaiyong Zhao, Shenzhen (CN); Songzhou Yu, Shenzhen (CN); Shizhen Zheng, Shenzhen (CN); Yuewen Ma, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 279 days.

(21) Appl. No.: 16/548,217

(22) Filed: Aug. 22, 2019

(65) Prior Publication Data

US 2020/0143093 A1 May 7, 2020

Related U.S. Application Data

(63) Continuation of application No. PCT/CN2017/074591, filed on Feb. 23, 2017.

(51) Int. Cl.
 *G06F 30/20* (2020.01)
 *G05B 13/04* (2006.01)

(52) U.S. Cl.
 CPC ........... *G06F 30/20* (2020.01); *G05B 13/042* (2013.01)

(58) Field of Classification Search
 CPC ........ G06F 30/20; G05B 13/042; G05B 17/02
 See application file for complete search history.

(56) References Cited

U.S. PATENT DOCUMENTS

2009/0087029 A1* 4/2009 Coleman ............ G06K 9/00208
 382/103
2011/0301925 A1* 12/2011 McWilliams, III ...... G09B 9/08
 703/6
(Continued)

FOREIGN PATENT DOCUMENTS

| CN | 105676871 A | 6/2016 |
| CN | 105807762 A | 7/2016 |

(Continued)

OTHER PUBLICATIONS

Sikorsky Product History. "X-Wing". AW Linden—1986—dspace-erf.nlr.nl. 16 Pages. (Year: 1986).*

(Continued)

*Primary Examiner* — Eunhee Kim
(74) *Attorney, Agent, or Firm* — Anova Law Group, PLLC

(57) ABSTRACT

A method includes simulating one or more states of a movable object by implementing a movable object model. Each simulated state is associated with simulated state data of the movable object. The method further includes determining one or more sets of simulated sensor data corresponding to the one or more simulated states respectively by implementing a plurality of sensor models, determining environment data of a simulated environment surrounding the movable object by implementing an environment model, (Continued)

providing the one or more sets of simulated sensor data to a movable object controller configured for generating control signals to adjust states of the movable object, and providing the simulated state data and the environment data to a vision simulator configured for visualizing operations of the movable object in the one or more simulated states.

19 Claims, 20 Drawing Sheets

(56) References Cited

U.S. PATENT DOCUMENTS

| | | | |
|---|---|---|---|
| 2011/0307213 A1* | 12/2011 | Zhao | G06F 1/1626 |
| | | | 702/153 |
| 2015/0064657 A1* | 3/2015 | Hales | G09B 9/48 |
| | | | 434/30 |
| 2016/0314224 A1* | 10/2016 | Wei | G06F 30/20 |
| 2016/0357525 A1 | 12/2016 | Wee et al. | |
| 2017/0132334 A1* | 5/2017 | Levinson | G06F 30/20 |
| 2017/0286570 A1* | 10/2017 | Kim | G06F 30/20 |
| 2018/0095433 A1* | 4/2018 | Rico | G05D 1/0044 |
| 2018/0096611 A1* | 4/2018 | Kikuchi | G08G 5/045 |

FOREIGN PATENT DOCUMENTS

| | | |
|---|---|---|
| CN | 107295542 A | 10/2017 |
| CN | 109155681 A | 1/2019 |

OTHER PUBLICATIONS

Schmidt. "Simulation and Control of a Quadrotor Unmanned Aerial Vehicle". The Graduate School University of Kentucky. 2011. 129 Pages. (Year: 2011).*
Navabi et al. "Mathematical modeling and simulation of the earth's magnetic field: A comparative study of the models on the spacecraft attitude control application."Applied Mathematical Modelling 46 (2017) 365-381. (Year: 2017).*
Sugimoto, Yoichi, and Craig Sauer. "Effectiveness estimation method for advanced driver assistance system and its application to collision mitigation brake system." Proceedings of the 19th International Technical Conference on the Enhanced Safety of Vehicles. 2005. 8 Pages. (Year: 2005).*
Aragon CR, Hearst MA. Improving aviation safety with information visualization: a flight simulation study. InProceedings of the SIGCHI conference on Human factors in computing systems Apr. 2, 2005 (pp. 441-450). (Year: 2005).*
The World Intellectual Property Organization (WIPO) International Search Report and Written Opinion for PCT/CN2017/074591 dated Nov. 14, 2017 7 pages.

* cited by examiner

564

562

700

702
Simulate, by implementing a movable object model, one or more states of a movable object, each simulated state associated with simulated state data of the movable object.

704
Determine, by implementing a plurality of sensor models, one or more sets of simulated sensor data corresponding to the one or more simulated states respectively.

706
Determine, by implementing an environment model, environment data of a simulated environment surrounding the movable object.

708
Provide the one or more sets of simulated sensor data to a movable object controller configured for generating control signals to adjust states of the movable object.

710
Provide the simulated state data and the environment data to a vision simulator configured for visualizing operations of the movable object in the one or more simulated states.

712
The movable object model is a four-axis X-wing copter, a six-axis X-wing copter, or an eight-axis X-wing copter.

714
The movable object model comprises a DC motor model and a movable object body model for determining the simulated state data.

724
The one or more simulated states comprises mechanical failures of a propulsion system of the movable object, failures of one or more sensors associated with the movable object, changes in the Earth's magnetic field, a collision between the movable object and another object, an obstacle avoidance, a target detection, and/or a target tracking.

726
The simulated state data of the movable object comprises a displacement, a velocity, an acceleration, an attitude, an angular velocity, an angular acceleration, a longitude, a latitude, and/or a height of the movable object.

Ⓑ

728
Determining the one or more sets of simulated sensor data by implementing the plurality of sensor models further comprises:
integrating the simulated state data and the environment data to obtained the one or more sets of simulated sensor data.

730
The plurality of sensor models are used for obtaining simulated sensor data of an accelerometer, a gyroscope, a magnetometer, a GPS receiver, an ultrasonic sensor, a thermometer, and a barometer that are associated with the movable object.

732
The environment data comprises an Earth's magnetic field strength calculated based on the simulate state data comprising a longitude, a latitude, a height, and a time of the movable object.

734
The environment data comprises an air pressure and an ambient temperature calculated based on a simulated height of the movable object.

736
The environment data comprises a magnetic disturbance to the movable object calculated based on a location, a shape, and a current intensity of an Earth's magnetosphere disturbance at a simulated location of the movable object.

(D)

738
The control signals are generated based on PWM signals.

812
Simulating views of the one or more imaging sensors further comprises: translating the state data from a movable object's coordinate system to the imaging sensors' coordinate system using the positional data of the imaging sensor.

814
The simulated views comprise 3-dimensional images.

816
The one or more imaging sensors comprise an imaging device supported by a carrier borne on the movable object or a plurality of cameras of a visual odometry system.

(M)

818
Providing the simulated views for display comprises:
sending the simulated views to a remote controller for display.

820
Providing the simulated views for display comprises:
sending the simulated views to an application running on a portable device for display.

Figure 8B

METHOD AND SYSTEM FOR SIMULATING MOVABLE OBJECT STATES

CROSS-REFERENCE TO RELATED APPLICATION

This application is a continuation of International Application No. PCT/CN2017/074591, filed Feb. 23, 2017, the entire contents of which are incorporated herein by reference.

TECHNICAL FIELD

The disclosed embodiments relate generally to simulating and testing operations of movable objects and more particularly, but not exclusively, to simulating movable object states.

BACKGROUND

Movable objects such as unmanned aerial vehicles (UAVs) can be used for performing surveillance, reconnaissance, and exploration tasks for military and civilian applications. A movable object usually is associated with a plurality of sensors configured for performing various functions. It is important to test the performance of the movable object and the performance of the plurality of sensors under various environments.

SUMMARY

There is a need for a movable object simulation system that simulates operations of the movable object under various simulated environments for testing mechanical failures of the movable object, malfunctions of the sensors, and/or interactions between the movable object and other objects in the environment.

In accordance with some embodiments, a method for simulating operations of a movable object. The method comprises simulating one or more states of a movable object by implementing a movable object model. Each simulated state is associated with simulated state data of the movable object. The method comprises determining one or more sets of simulated sensor data corresponding to the one or more simulated states respectively by implementing a plurality of sensor models. The method further comprises determining environment data of a simulated environment surrounding the movable object by implementing an environment model. The method also comprises providing the one or more sets of simulated sensor data to a movable object controller configured for generating control signals to adjust states of the movable object. The method also comprises providing the simulated state data and the environment data to a vision simulator configured for visualizing operations of the movable object in the one or more simulated states In accordance with some embodiments, a system may comprise one or more processors; memory; and one or more programs. The one or more programs are stored in the memory and configured to be executed by the one or more processors. The one or more programs including instructions for performing the operations of the above method. In accordance with some embodiments, a non-transitory computer-readable storage medium has stored therein instructions that, when executed by the electronic device, cause the electronic device to perform the operations of the above method.

In accordance with some embodiments, a method for simulating vision data comprises obtaining state data associated with one or more states of a movable object, environment data related to an environment surrounding the movable object, and positional data of one or more imaging sensors borne on the movable object. The method further comprises simulating filed(s) of view of the one or more imaging sensors based on the state data, the environment data, and the positional data. The method further comprises providing the simulated views for display.

In accordance with some embodiments, a system may comprise one or more processors; memory; and one or more programs. The one or more programs are stored in the memory and configured to be executed by the one or more processors. The one or more programs including instructions for performing the operations of the above method. In accordance with some embodiments, a non-transitory computer-readable storage medium has stored therein instructions that, when executed by the electronic device, cause the electronic device to perform the operations of the above method.

In accordance with some embodiments, a system comprises a state simulator configured to execute one or more programs to (1) simulate one or more states of a movable object, each simulated state associated with simulated state data of the movable object; (2) determine one or more sets of simulated sensor data corresponding to the one or more simulated states; and (3) determine environment data of a simulated environment surrounding the movable object. The system further comprises a movable object controller communicatively coupled to the state simulator and configured to generate control signals to adjust states of the movable object. The system also comprises a vision simulator communicatively coupled to the state simulator and the movable object controller. The vision simulator configured to visualize operations of the movable object in the one or more simulated states.

BRIEF DESCRIPTION OF THE DRAWINGS

FIGS. 7A-7D are flow diagrams illustrating a method for determining state data by a state simulator of a movable object simulation system, in accordance with some embodiments.

FIGS. 8A-8C are flow diagrams illustrating a method performed by a vision simulator of a movable object simulation system, in accordance with some embodiments.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

The following description uses an unmanned aerial vehicle (UAV) (e.g., a copter) as an example of a movable object (e.g., a movable platform). UAVs include, e.g., fixed-wing aircrafts and rotary-wing aircrafts such as helicopters, quadcopters, and aircraft having other numbers and/or configurations of rotors. In some embodiments, the movable platform also includes, but is not limited to, a self-driving car (i.e., an autonomous car, a driverless car), a virtual reality (VR) headset, an augmented reality (AR) headset, a handheld gimbal with a camera and image processing capabilities. It will be apparent to those skilled in the art that other types of movable platforms may be substituted for UAVs as described below, such as a mobile phone, a tablet, or a remote control.

The present disclosure provides techniques related to simulating and visualizing operations of movable object. In some embodiments, a state simulator is used for implementing movable object models, sensor models, and environment models to simulate state data, sensor data, and environment data respectively. In some embodiments, a vision simulator is used for simulating visual data associated with the movable object, scene data of the environment, and image data from perspectives of imaging device(s) or imaging sensor(s) borne on the movable object. By using a movable object simulation system including the state simulator and the vision simulator, it is efficient, effective, and economic to simulate and test the functionalities and operations of various controllers or algorithms implemented by the movable object such as a flight controller, vision-based algorithms, and the like. For example, movable object simulation system can be used to simulate mechanical failures of the movable object, malfunctions of the sensors, and interactions between the movable object and other objects in the environment. No real movable object and/or authenticate environment are needed for testing performance of the movable object using the movable object simulation system.

Figure 1:
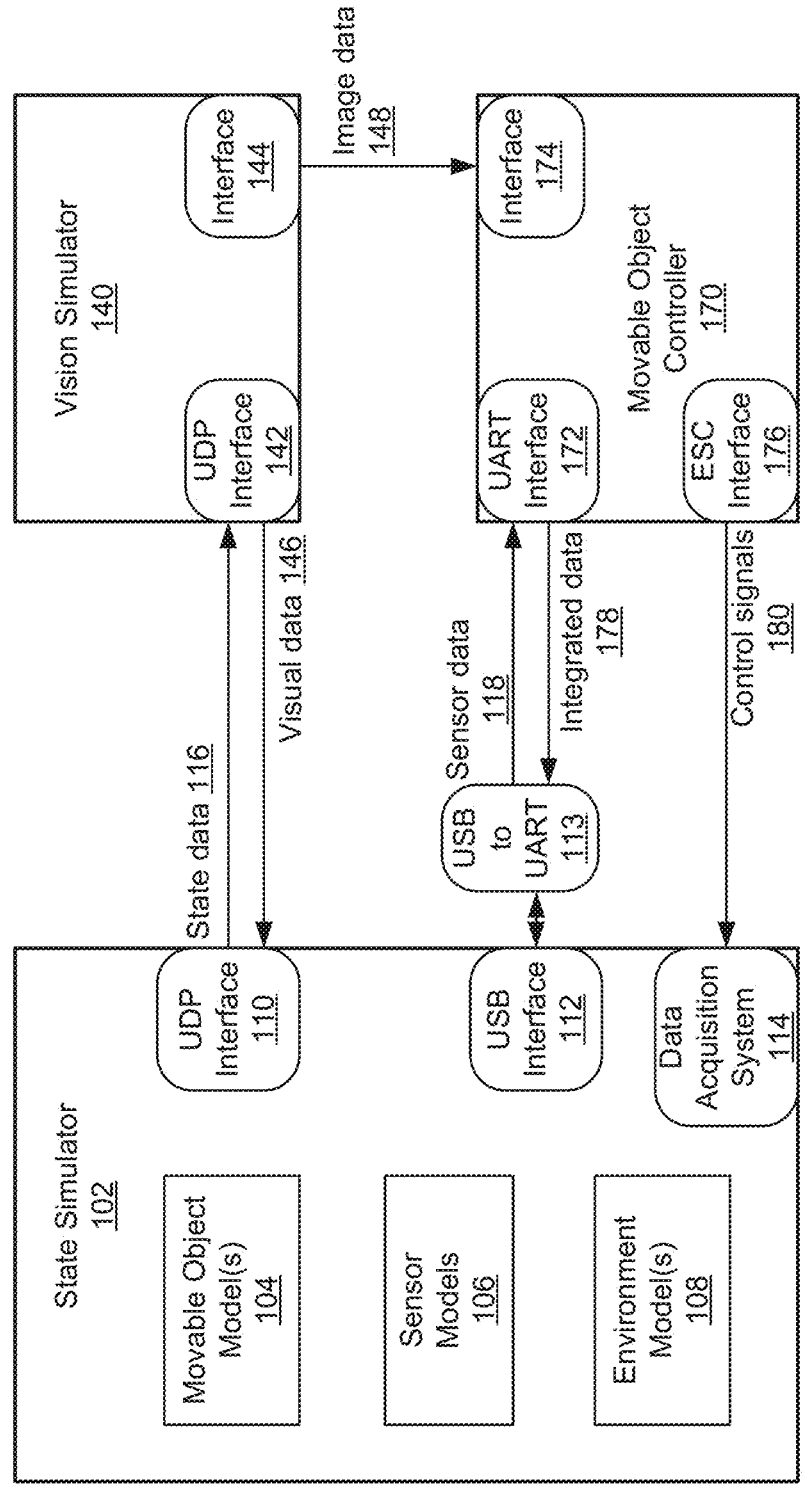
FIG. 1 illustrates a movable object simulation system, in accordance with some embodiments.

FIG. 1 illustrates a movable object simulation system 100, in accordance with some embodiments. The movable object simulation system 100 includes a state simulator 102, a vision simulator 140, and a movable object controller 170 that are communicably coupled to each other. The state simulator 102 is used for simulating one or more states of the movable object 102 by implementing a plurality of models. In some embodiments, the plurality of models include one or more movable object models 104, a plurality of sensor models 106, and one or more environment models 108. In some embodiment, the plurality of models are implemented using Matlab®/Simulink® software on one or more computing devices.

In some embodiments, the state simulator 102 comprises one or more communication interfaces, such as a UDP interface 110 in accordance with User Datagram Protocol (UDP) for exchanging data between the state simulator 102 and the vision simulator 140. For example, the state simulator 102 sends state data 116 to the vision simulator 140 via the UDP interface 110, and receives simulated visual data 146 from the vision simulator 140 via the UDP interface 110. In some other embodiments, the state simulator 102 comprises other suitable communication interface, such as an interface in accordance with Transmission Control Protocol (TCP) or a serial port, for communicating with the vision simulator. For example, instead using the UDP interface 110 and 142, the communication between the state simulator 102 and the vision simulator 140 can use TCP or a serial port for exchanging data between these two simulators.

In some embodiments, the state simulator 102 also includes a Universal Serial Bus (USB) interface 112 for communicating with a Universal Asynchronous Receiver/Transmitter (UART) interface 172 of the movable object controller 170 via a USB-to-UART converter 113. The USB interface 112, the USB-to-UART converter 113, and the UART interface 172 may be referred to as a USB-to-UART interface. In some examples, the state simulator 102 sends simulated sensor data 118 to the movable object controller 170 via the USB-to-UART communication interface, and receives integrated data 178 (e.g., data integrated based on the sensor data 118 and the image data 148 representing estimated state of the movable object) from the movable object controller 170 via the USB-to-UART communication interface. In some other embodiments, the communication between the state simulator 102 and the movable object controller 170 include other suitable communication interface, such as a Controller Area Network (CAN) interface, a serial port, or other type(s) of suitable communication interface.

In some embodiments, the state simulator 102 further comprises a data acquisition system 114 for receiving control signals 180 from the movable object controller 170. In some embodiments, the movable object controller 170 generates Pulse-width modulation (PWM) signals based on the image data 148 received from the vision simulator 140 and the sensor data 118 received from the state simulator 102. In some embodiments, an electronic speed control (ESC) interface 176 takes the PWM signals as input, and outputs the control signals 180 for controlling one or more motors of the movable object, so as to effectuate certain movement(s) and/or spatial disposition(s) of the movable object. In some embodiments, the control signals 180 include three-phase (or AC) electric power including low voltage source that is used for controlling the motors. For example, the data acquisition system 114 includes a NI PCI6602 data acquisition board. Alternatively, the data acquisition system 114 can include other suitable models of data acquisition system. In one example, the data acquisition system 114 is configured to receive the control signals 180 via multiple channels (e.g., 8 channels).

The vision simulator 140 can be configured to visualize the simulated states of the movable object. For example, the vision simulator 140 provides a visualization of the simulated states of the movable object based on the state data 116 received from the state simulator 102. Using computer vision algorithms, the vision simulator 140 may generate visual data 146 associated with such visualized states of the movable object. Examples of such visualization of the simulated states may include a collision with an object in the environment, state data such as a flying height of the movable object, a torque generated from a collision, a snap of a wing, a force applied to the movable object by the wind, etc. The vision simulator 140 further simulates 3-dimensional scenes within which the movable object is simulated to operate. For example, the vision simulator 140 simulates a 3-dimensional environment surrounding the movable object including mountains, buildings, trees, etc. Furthermore, the vision simulator 140 provides simulated image data 148 from perspectives of one or more imaging devices borne on the movable object, such as a primary imaging device (payload) carried by a gimbal system and/or one or more imaging sensors (e.g., stereoscopic cameras, depth cameras such as time-of-flight (TOF) cameras, infrared cameras, ultrasonic imaging sensor, a plurality of cameras of a visual odometry system, etc.) In some examples, the image data 148 includes simulated field(s) of view of multiple imaging sensors borne on a movable object, such as simulated views from two imaging sensors (e.g., a pair of stereoscopic cameras) located in front of the movable object, and simulated field(s) of view from two imaging sensors situated at the bottom of the movable object. In some embodiments, the image data 148 represents a first-person-view (FPV) image of one or more corresponding imaging sensors.

In some embodiments, the vision simulator 140 includes a communication interface, such as a UDP interface 142, for communicating with the state simulator 102. For example, the vision simulator 140 transmits the visual data 146 (e.g., associated with the states of the movable object) to the state simulator 102 vis the UDP interface 142. The vision simulator 140 may also comprise a communication interface, such as a Mobile Industry Processor Interface (MIPI) and/or UART interface 144, for sending image data 148 (e.g., from perspectives of one or more imaging devices and/or imaging sensors borne by the movable object) to a communication interface 174 of the movable object controller 170.

The movable object controller 170 is used for controlling operations and adjusting states of the movable object. In some embodiments, the movable object controller 170 can be used for operating a movable object. In some embodiments, the movable object controller 170 generates Pulse-width modulation (PWM) signals based on the sensor data 118 received from the state simulator 102 and the image data 148 received from the vision simulator 140. In some embodiments, the ESC interface 176 generates the control signals 180 based on the PWM signals, and the control signals 180 are used for controlling one or more actuators (e.g., motors) of the movable object, so as to effectuate certain movement(s) and/or spatial disposition(s) of the movable object. For example, the control signals 180 can be used for accelerating, decelerating, turning, or halting the movable object. The control signals 180 can also be used for adjusting the orientation of the movable object, and/or the orientation of a gimbal system borne on the movable object. In some embodiments, the movable object controller 170 integrates the sensor data 118 and the image data 148 to obtain an estimated state of the movable object, such as using Kalman filter, extended Kalman filter, or any suitable sensor fusion algorithms. The estimated state determined by the movable object controller 170 is represented by the integrated data 178. Such estimated state of the movable object is different from the simulated state (also referred to as ground truth state) determined by the state simulator 102. In some embodiments, the estimated state represented by the integrated data 178 can include a position, an orientation, an angular velocity, a linear velocity, an angular acceleration, a linear acceleration, a relative position between the movable object and an object (e.g., a target) in the environment, a relative velocity between the movable object and an object in the environment, and/or other suitable types of state data that are associated with the estimated state of the movable object. The integrated data 178 is transmitted to the state simulator 102 via the USB-to-UART communication interface. The state simulator 102 then compares the received integrated data 178 associated with the estimated state of the movable object with the state data 116 (also referred to as ground truth data) associated with the simulated state (e.g., ground truth state) of the movable object. In some embodiments, the movable object controller 170 generates the Pulse-width modulation (PWM) signals based on the sensor data 118, the image data 148, and the integrated data 178.

In some embodiments, the movable object controller 170 comprises one or more communication interfaces for communicating with the vision simulator 140 and the state simulator 102 respectively. For example, the movable object controller 170 includes a UART interface 172 for receiving the sensor data 118 from the state simulator 102 and a MIPI interface (e.g., adopting MIPI Specification issued by MIPI Alliance) and/or UART interface 174 for receiving the image data 148 from the vision simulator 140. In some embodiments, the movable object controller 170 transmits the control signals 180, which are generated based on the Pulse-width modulation (PWM) signals by the electronic speed control (ESC) interface 176 for controlling motors of the movable object, to the state simulator 102.

In some embodiments, based on the control signals 180 received from the movable object controller 170, the movable object models 104 are implemented to output the state data 116 corresponding to one or more simulated states of a movable object. In some examples, the state data 116 (may also referred to as simulated state data) includes a displacement (e.g., a change of the position), a speed, an acceleration, orientation angles (or attitude), an angular velocity, and other types of state data. In some embodiments, the state data 116 is referred to as ground truth data and the simulated state of the movable object is referred to as ground truth state. As discussed elsewhere in the present disclosure, the state data 116 is transmitted to the vision simulator 140 for the vision simulator 140 to process and generate the visual data 146 associated with the visualization of the movable object states.

In some embodiments, the sensor models 106 are implemented to output the sensor data 118. In some embodiments, the sensor data 118 are generated based on the state data 116 and the environment data (e.g., environment data 204, FIG. 2) generated from the environment models 108. In some embodiments, the sensor models 106 include a plurality of models used for simulating measurements of a plurality of sensors associated with the movable object respectively. These sensors are used for measuring data related to states of the movable object. The sensor data 118 includes a plurality sets of data corresponding to simulated measurements from the plurality of sensors respectively. For example, the sensor data 118 includes simulated measurements from a GPS receiver, inertial measurement units (IMU), an accelerometer, a gyroscope, a compass, a barometer, a thermometer, and/or other types of sensors associated with the movable object.

Figure 2:
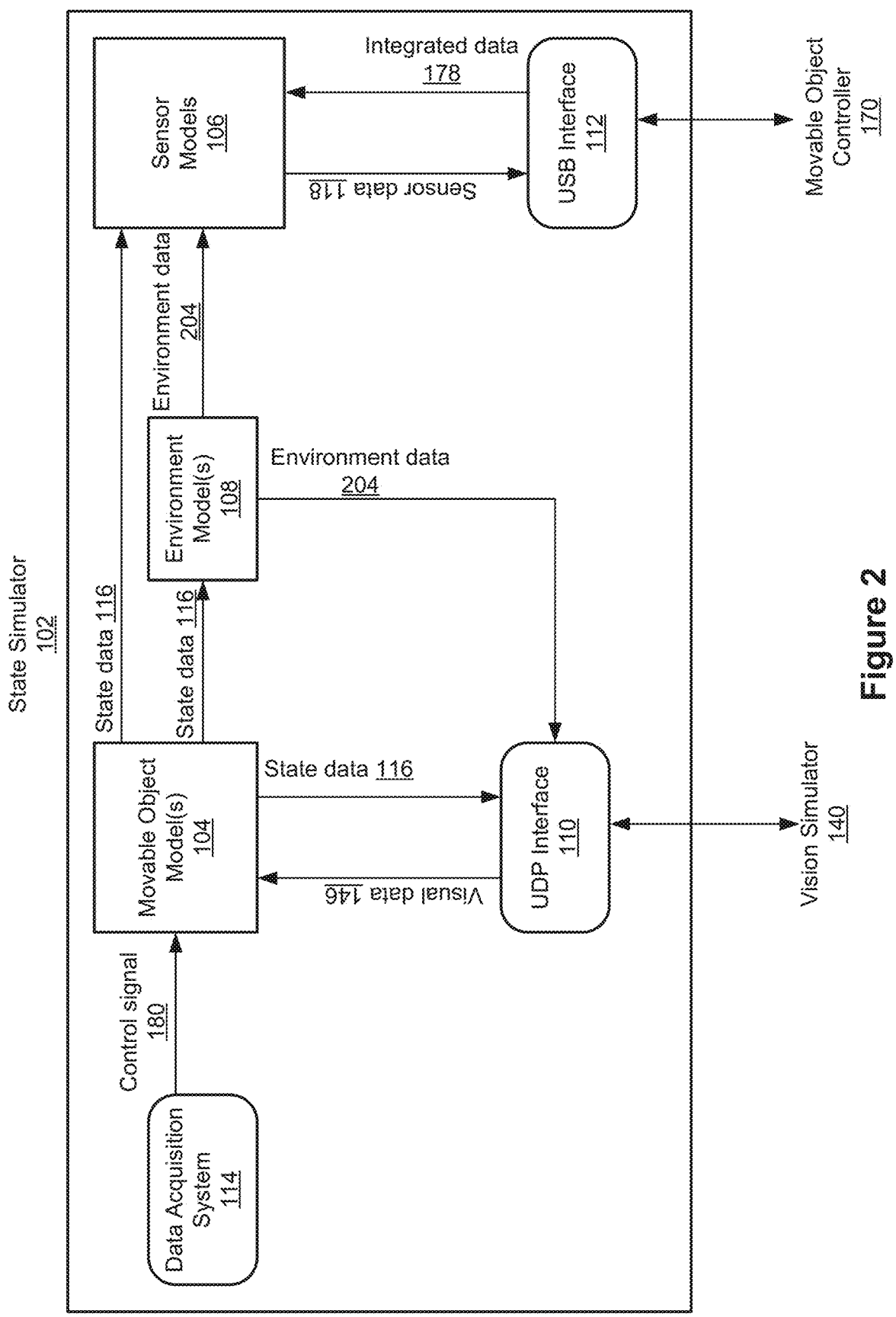
FIG. 2 illustrates a diagram of a state simulator of a movable object simulation system, in accordance with some embodiments.

In some embodiments, the environment models 108 are implemented to output the environment data (e.g., environment data 204, FIG. 2). In some embodiments, the environment data 204 include data of a simulated environment within which the movable object is operated. In some examples, the environment data 204 includes simulated measurements of one or more sensors configured to measure the environment within which the movable object is operated. For example, the environment data 204 includes a height (also referred to as an altitude), a latitude, a longitude, a time, and the Earth's magnetic field strength at a location where the movable is located, and other suitable types of environment data.

As discussed elsewhere in the present disclosure, the state simulator 102 also compares the integrated data 178 determined by the movable object controller 170 with the state data 116 determined by the state simulator 102 to test and evaluate whether the movable object controller 170 is functioning properly. For example, the comparison results can be used for testing whether the inertial navigation system algorithms implemented by the movable object controller 170 are functioning properly.

As shown in FIG. 1, the simulation system including the state simulator 102, the vision simulator 140, and the movable object controller 170 form a hardware-in-the-loop (HIL) simulation for testing and simulating operations of the movable object. The HIL simulation system discussed in the present disclosure can save cost and time for testing compared to real movable object testing in real operating scenarios. The HIL simulation system can also provide testing in some scenarios that may be difficult or expensive to create under real object testing.

FIG. 2 illustrates a diagram of the state simulator 102, in accordance with some embodiments. In some embodiment, the state simulator 102 is implemented by a single computing device. In other embodiments, the state simulator 102 is implemented by multiple computing devices working together to perform the related actions. In some embodiments, one or more parts of the functionalities of the state simulator 102 are implemented via cloud computing. In some embodiments, the state simulator 102 is implemented on one or more computing devices configured for performing real-time hardware-in-the-loop (HIL) simulation, such as systems developed by dSPACE or speedgoat. In some embodiments, the state simulator 102 is implemented on a computing device where the plurality of models (e.g., the movable object model 104) are compiled, saved, and executed in real time using Simulink Desktop Real-Time™. The sampling rate may be about 1 kHz. The sampling rate can also be selected to be less than or greater than 1 kHz, such as 100 Hz, 500 Hz, 800 Hz, 1.2 kHz, 1.5 kHz, 2 kHz, or 5 kHz. In some alternative embodiments, the state simulator 102 is implemented on at least two computing devices where a first computing device is used for compiling the models (e.g., the movable object model 104), and the compiled models are transmitted to and saved at a second computing device which is used for executing the models (e.g., the movable object model 104) to obtained simulated data (may also referred to as simulated state data). The sampling rate for this scenario may be as high as 10 kHz, 15 kHz, 18 kHz, 20 kHz, 25 kHz, 30 khz, or 50 kHz. The first and second computing devices can be communicated with each other via TCP/IP communication, UDP communication interface, UART communication interface, USB-to-UART communication interface, a serial port, or other type(s) of suitable communication interface.

As shown in FIG. 2, in some embodiments, the movable object models 104 are used for determining state data 116 associated with the simulated states of the movable object. In some examples, the movable object models 104 are used for simulating a lift force (e.g., a thrust), a torque, and/or a centrifugal force generated by a propeller of the movable object. The movable object models 104 receive the control signals 180, via the data acquisition system 114, from the movable object controller 170. The movable object models 104 also receive the visual data 146 from the vision simulator via the UDP interface 110. The movable object models 104 then determine the state data 116 (e.g., ground truth data) (as described in various exemplary embodiments with reference to FIG. 3) associated with simulated states (e.g., ground truth states) of the movable object based on the control signals 180 and the visual data 146. In some embodiments, the state data 116 includes a location (e.g., coordinates), a displacement, a speed, an acceleration, orientation angles (or attitude), an angular velocity, and other types of state data that are associated with states of the movable object. In some embodiments, the state data 116 is determined using the movable object model 104 (e.g., the body model 304, FIG. 3).

The state data 116 is transmitted to the vision simulator 140, the environment models 108, and the sensor models 106. The environment models 108 are implemented to determine the environment data 204, such as a height, a latitude, a longitude, a time, and the Earth's magnetic field strength at a location where the movable is located, and other suitable types of environment data. The environment data 204 is transmitted to the vision simulator 140 via the UDP interface 110, and to the sensor models 106.

The sensor models are implemented to determine sensor data 118 (as described in various exemplary embodiments with reference to FIGS. 5A-5E), such as simulated measurements of a plurality of sensors associated with the movable object. The sensor data 118 may be determined based on the environment data 204, the state data 116, and the integrated data 178 received from the movable object controller 170. The sensor data 118 is transmitted to the movable object controller 170 via the USB interface 112. In some embodiments, the state simulator 102 compares the state data 116 and the integrated data 178 received from the movable object controller 170 to determine whether the movable object controller is operating properly.

Figure 3:
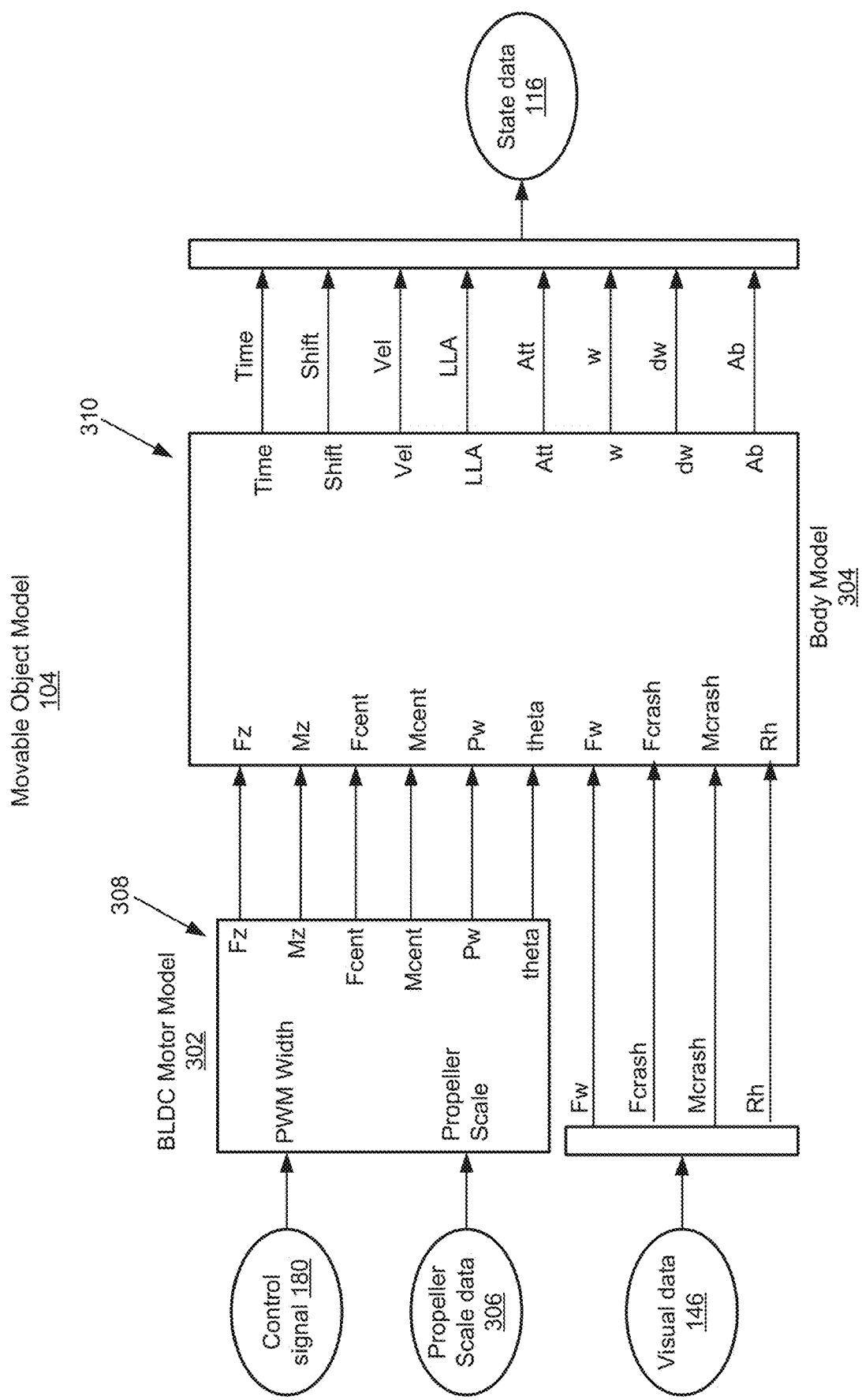
FIG. 3 illustrates a diagram of a movable object model of a movable object simulation system, in accordance with some embodiments.

FIG. 3 illustrates an exemplary movable object model 104, in accordance with some embodiments. In some embodiments, the movable object model 104 includes a motor model 302 and a body model 304. The motor model 302 may simulate a Brushless DC electric motor (BLDC motor). In some embodiments, the input data for the motor model 302 includes control signals 180 (e.g., based on PWM signals) received from the ESC interface 176 of the movable object controller 170. The input data also includes propeller scale data 306 associated with the propeller of the movable object. For example, the propeller scale data indicates a state of the propeller, such as a breakage, a crack, a length, and/or a breaking point of the propeller. The motor model 302 is implemented to output a set of data 308 associated with the propeller dynamics based on the control signals 180 and the propeller scale data 306. For example, the the set of data 308 can include a propeller thrust (Fz), a propeller torque (Mz), a centrifugal force (Fcent), an eccentric torque (Mcent), an angular velocity (Pw) of the propeller, an angle (theta) of the propeller, and the like. For the motor model 302, in some embodiments, the propeller thrust (Fz), the propeller torque (Mz), the centrifugal force (Fcent), and/or the eccentric torque (Mcent) can be determined using one or more parameters including propeller scale of the left and right wings, a lift coefficient, a dynamic propeller rotational speed, and other suitable parameters.

The output data from the motor model 302 is fed into the body model 304. In addition, the visual data 146 received from the vision simulator 140 is also fed into the body model 304. In some embodiments, the visual data 146 includes data related to interactions between the movable object and one or more objects in the environment. In some examples, the visual data 146 includes, but is not limited to, a force applied to the movable object by the wind (Fw), a force applied to the movable object during a collision between the movable object and another object in the environment (Fcrash), a torque generated by the collision (Mcrash), and one or more data items selected from the state data 116 such as a height (e.g., an altitude) between the movable object and the ground (Rh). The body model 304 is implemented to output a set of data 310 associated with the simulated state of the movable object. In some embodiments, the set of data 310 can include a time (Time) (during the simulation of the operation of the movable object), a displacement (Shift) (or a travelling distance, a displacement of the movable object between the current location and an initial location), a linear velocity (Vel), a linear acceleration (Ab), an attitude (Att) (or orientation angles), an angular velocity (w), an angular acceleration (dw), and a longitude, a latitude, and an altitude (referred to as LLA jointly). The set of data 310 is output from the movable object model 104 as the state data 116 as discussed elsewhere in the present disclosure.

In some embodiments, the movable object models 104 is used for simulating operation states and dynamics of different types of movable object, such as a four-axis X-wing copter, a six-axis X-wing copter, or an eight-axis X-wing copter. For example, the movable object models 104 can simulate movable object states, such as motor dynamics and body vibration, caused by breakage of the propellers (or wings) of the movable object. In some embodiments, the propeller scale data 306 can be changed to simulate the movable object states in response to the corresponding propeller breaking or cracking scenarios.

Figure 4A:
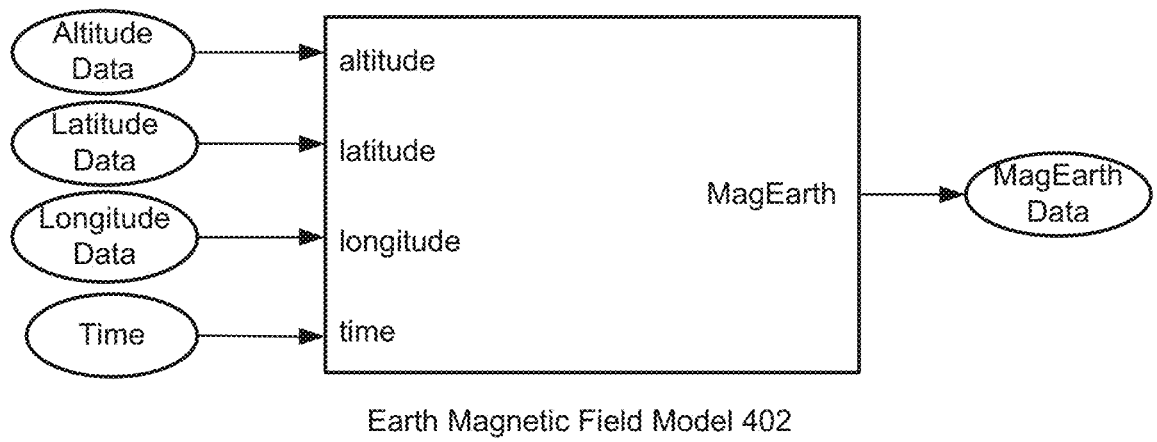
FIGS. 4A-4C illustrate diagrams of exemplary environment models of a movable object simulation system, in accordance with some embodiments.
Figure 4B:
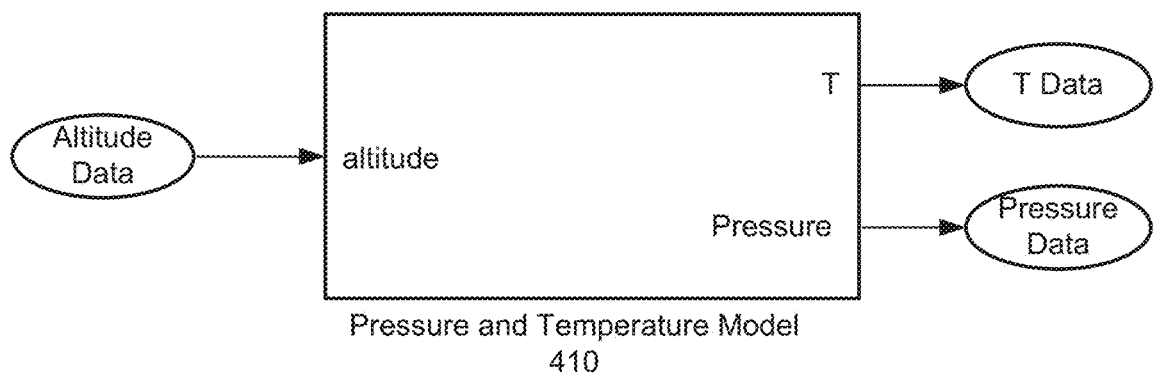
Figure 4C:
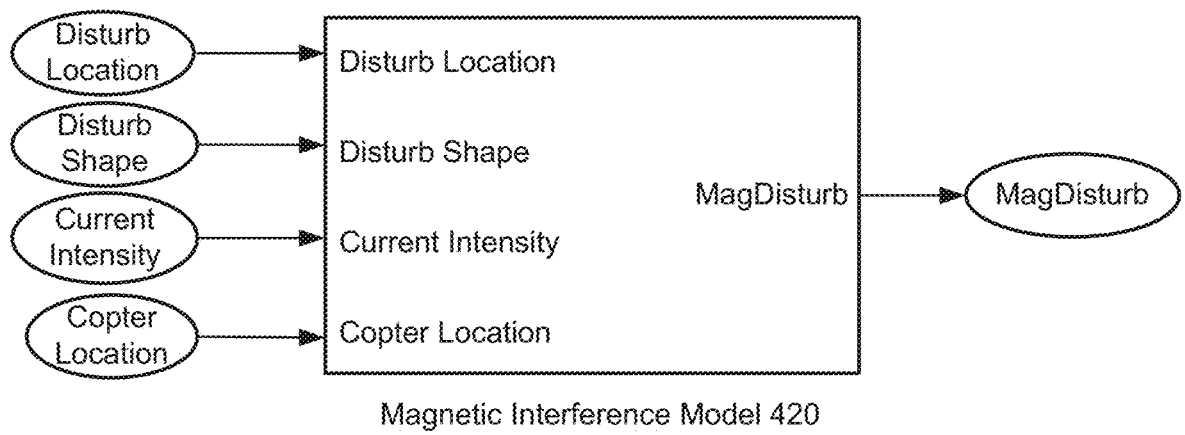

FIG. 4A-4C illustrate diagrams of a plurality of environment models 108, in accordance with some embodiments. The environment models 108 determine the environment data 204 based on the state data 116. FIG. 4A illustrates an Earth magnetic field strength model 402. In some embodiments, data associated with a latitude, a longitude, an altitude (collectively LLA) and a time of the movable object are fed into the Earth magnetic field strength model 402. The Earth magnetic field strength model 402 is implemented to output a magnetic field strength at the location of the movable object.

FIG. 4B illustrates a pressure and temperature model 410 for determining pressure and temperature of the environment of the movable object. An altitude of the movable object is input to the model 410 to obtain temperature data and atmospheric pressure data at such height.

FIG. 4C illustrates a magnetic interference model 420 for determining the magnetic interference which may have impact on the compass for navigating the movable object. In some embodiments, data associated with the magnetic disturbance (e.g., geomagnetic storm) location (disturb location), change of magnetic field lines (disturb shape), the current intensity of the magnetic field (current intensity), and a location of the movable object (copter location) are fed into the model 420 to output a magnetic interference strength (MagDisturb). In some embodiments during simulation, the magnetic field lines can be chosen to be those of a dipole magnetic field, a toroidal magnetic field, a U-shaped magnet, other suitable type of magnetic field, or a combination of one or more magnetic fields.

Figure 5A:
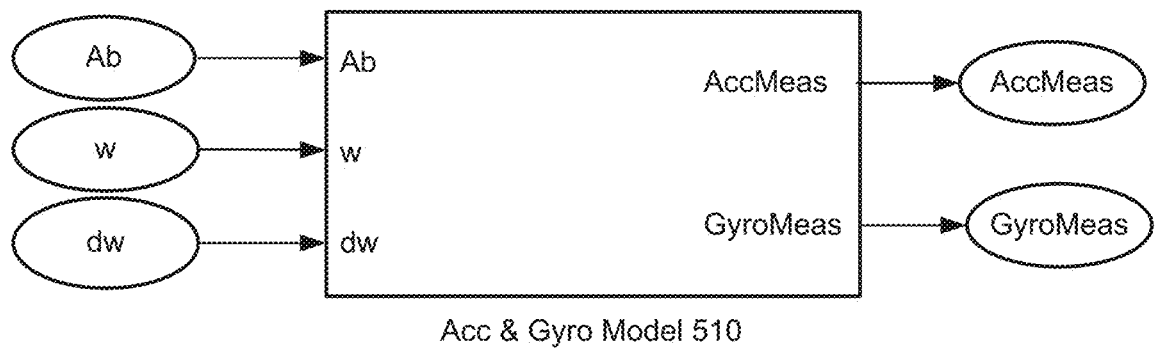
FIGS. 5A-5E illustrate diagrams of exemplary sensor models of a movable object simulation system, in accordance with some embodiments.

FIG. 5A-5E illustrate a plurality of exemplary sensor models 106, in accordance with some embodiments. The sensor models 106 can be used to determine the sensor data 118 based on the state data 116 and/or environment data 204. FIG. 5A illustrates an accelerometer and gyroscope model 510 for simulating measurements from such devices borne on the movable object. State data such as an acceleration (Ab), an angular velocity (w), and an angular acceleration (dw) are input to the model 510 to derive output sensor data including a simulated measurement of the accelerometer (AccMeas) and a simulated measurement of the gyroscope (GyroMeas). In some embodiments, the accelerometer and gyroscope borne on the movable object include damping devices, such as a damping sponge. The accelerometer and gyroscope model 510 may be simplified to use a second order system. In some embodiments, the determined sensor data 118 further includes various sensor noises, such as drift of the gyroscope and/or drift of the accelerometer.

Figure 5B:
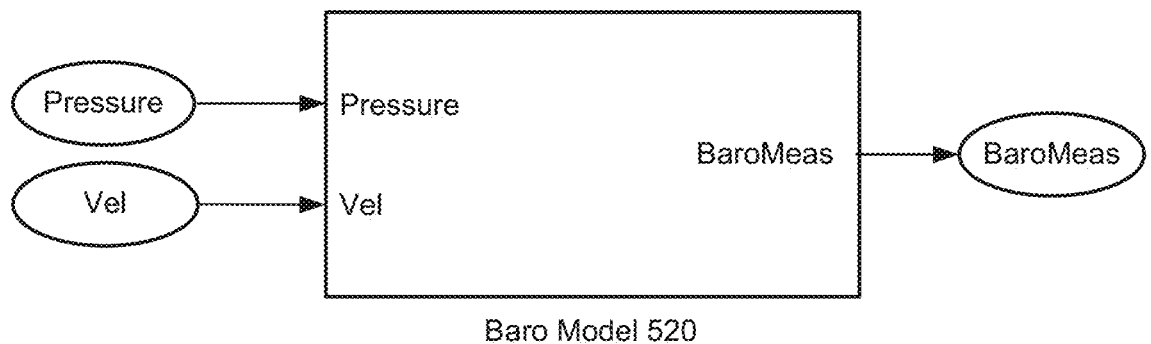

FIG. 5B illustrates a barometer model 520 for simulating measurement from a barometer of the movable object. Environment data such as an atmospheric pressure of the environment (pressure) and state data such as a velocity (vel) of the movable object are input to the model 520 to determine a simulated measurement of a barometer borne on the movable object. In some embodiments, atmospheric pressure is determined based on a height of the movable object and dynamics of wind motion surrounding the movable object.

Figure 5C:
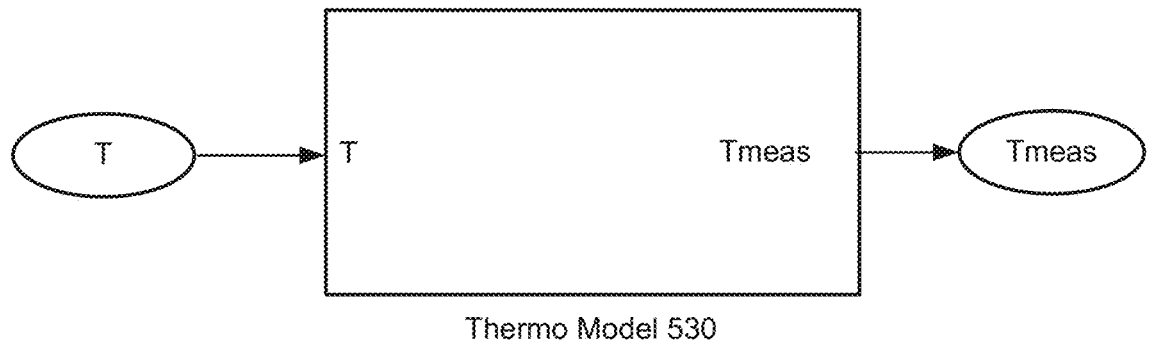

FIG. 5C illustrates a thermometer model 530 for simulating a measurement of a thermometer borne on the movable object. An atmospheric temperature (T) is input into the thermometer model 530 to obtain the simulated measurement of the thermometer. Intrinsic device noise may also be considered during the simulation.

Figure 5D:
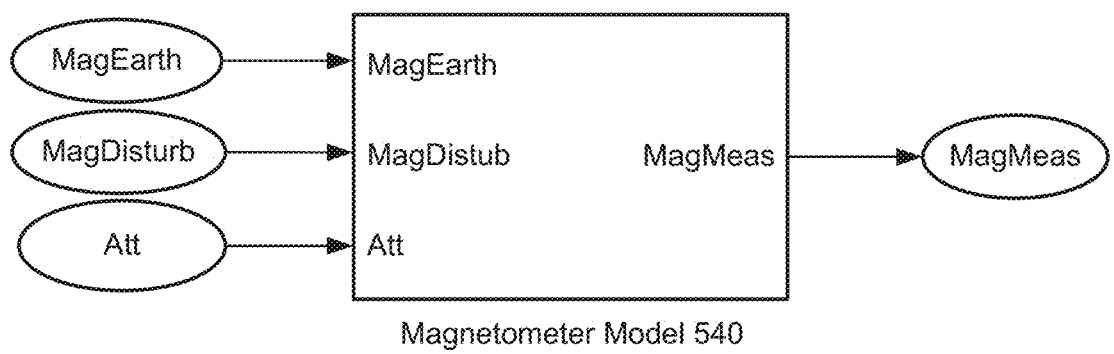

FIG. 5D illustrates a magnetometer model 540 for simulating a measurement of a magnetometer of the movable object. For example, the magnetometer can be a triple-axis magnetometer (a compass). Environment data such as magnetic field strength of the Earth at the movable object location (MagEarth) and magnetic interference strength (MagDisturb), and state data such as attitude data (Att) of the movable object are input to the model 540 to obtain the simulated measurement of the magnetometer (MagMeas).

Figure 5E:
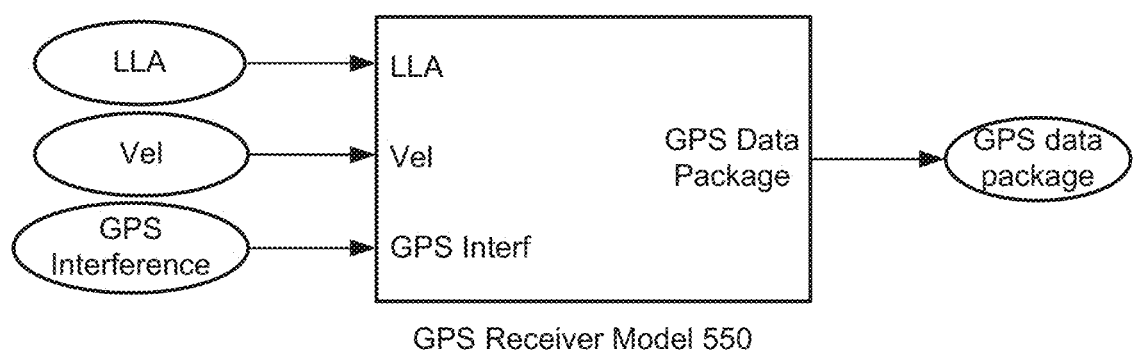

FIG. 5E illustrates a GPS receiver model 550 for simulating a measurement of a GPS receiver borne on the movable object. Data associated with a latitude, a longitude, an altitude (collectively LLA), a velocity (vel) of the movable object, and GPS interference from various sources (GPS interf) (such as radio emissions in nearby frequency bands, intentional or unintentional jamming, and/or naturally occurring space weather) associated with the movable object are input to the model 550 to obtain the simulated measurement of the GPS receiver (GPS data package). In some embodiments, the GPS data package comprises measurement data including, but not limited to, an altitude, a latitude, a longitude, velocities along three directions, vertical accuracy, horizontal accuracy, GPS receiver status, and a number of GPS satellites that are available.

In some embodiments, various scenarios can be tested using the movable object simulation system by using different input data or by tuning different types of models as discussed with reference to FIGS. 3, 4A-4C, and 5A-5E. In one example, in order to test the mechanical failure of the movable object, a dynamic model associated with the breakage of the propeller can be combined with the movable object model 104 to obtain state data associated with a scenario where one or more propellers of the movable object are broken. In another example, in order to test sensor malfunction, models associated with data loss or data transmission failure can be added to one or more of the sensor models 106 (e.g., the accelerometer and gyroscope model 510) to obtain sensor data under such type of sensor malfunction scenario. In yet another example, in order to test magnetic interference from foreign object, such as a magnet in the environment, models associated with such type of magnetic interference can be incorporated into one or more of the environment model 108 (e.g., magnetic interference model 420) to obtain magnetic disturbance data. The magnetic disturbance data can then be fed to the sensor models 106 (e.g., magnetometer model 540) as part of the environment data to obtain simulated measurement of the magnetometer or compass borne on the movable object under such scenario.

Figure 6A:
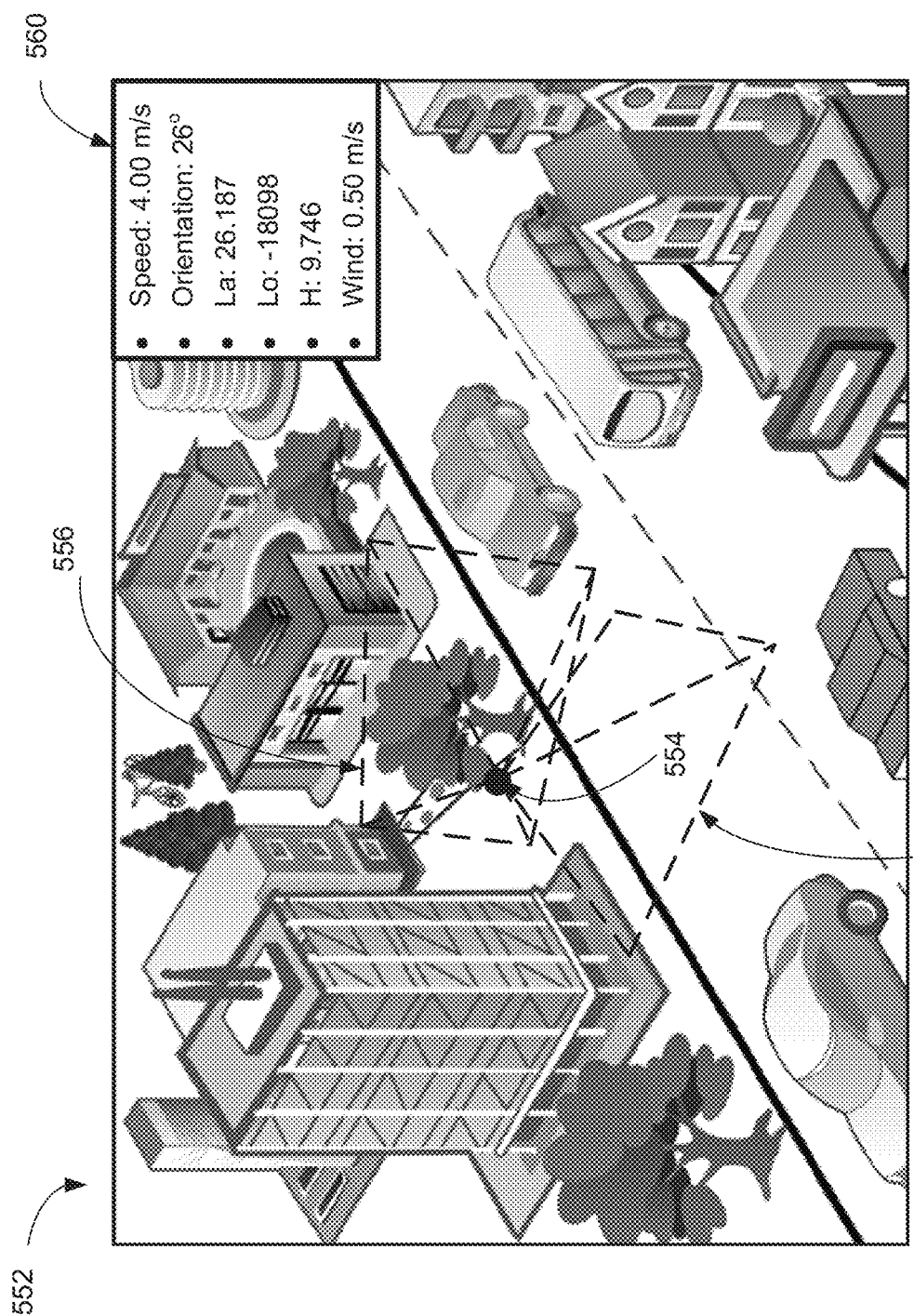
FIG. 6A is an illustrative image from a perspective of a movable object that is simulated by a vision simulator of a movable object simulation system, in accordance with some embodiments.
Figure 6B:
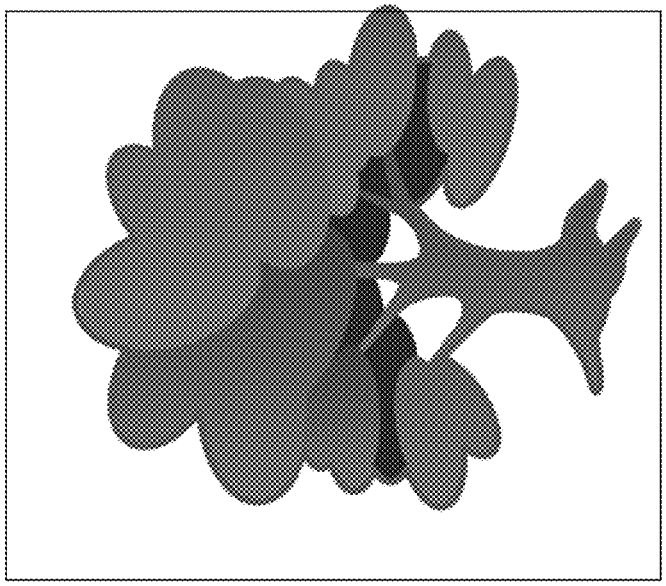
FIG. 6B includes a pair of illustrative images simulated to represent respective fields of view of front imaging devices of a vision simulator of a movable object simulation system, in accordance with some embodiments.
Figure 6B:
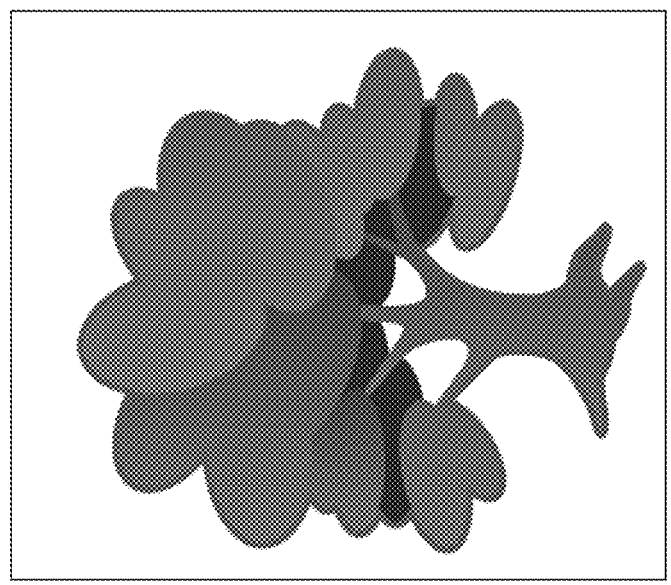
Figure 6C:
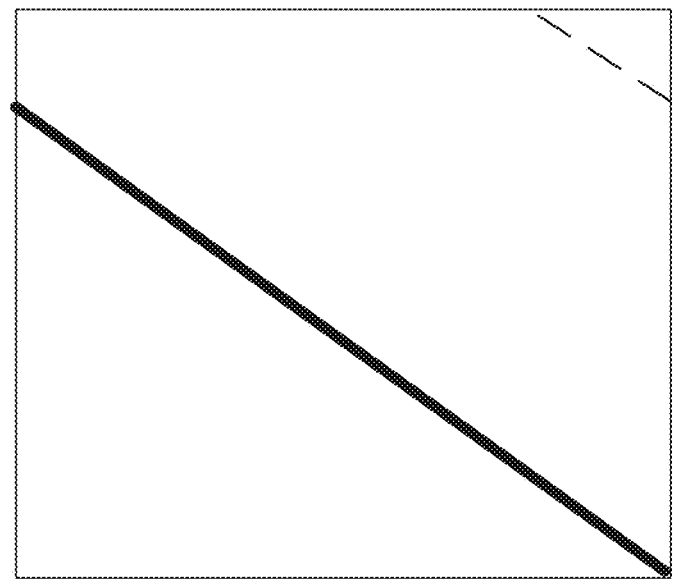
FIG. 6C includes a pair of illustrative images simulated to represent respective fields of view of bottom imaging devices of a vision simulator of a movable object simulation system, in accordance with some embodiments.
Figure 6C:
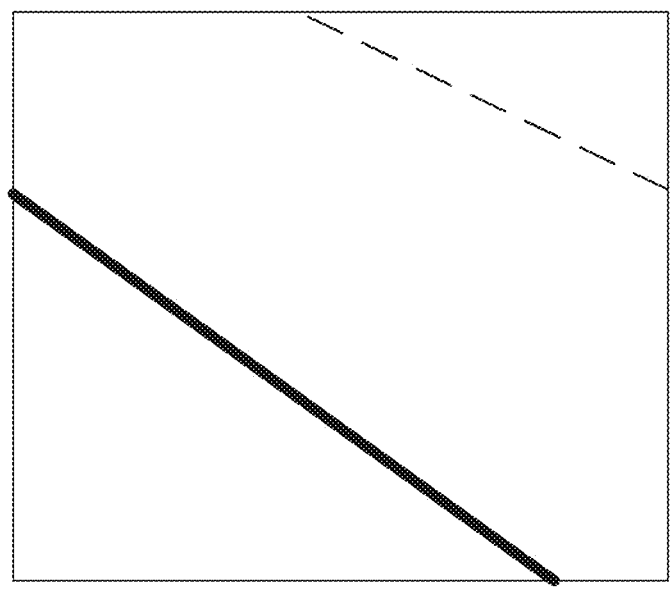

FIG. 6A is an illustrative image 552 from a perspective of a movable object that is simulated by the vision simulator 140 of the movable object simulation system 100 (e.g., FIG. 1), in accordance with some embodiments. FIG. 6B includes a pair of illustrative images 562 and 564 simulated to represent respective fields of view of front imaging devices (e.g., a pair of stereoscopic cameras) of the vision simulator 140, in accordance with some embodiments. FIG. 6C includes a pair of illustrative images 566 and 568 simulated to represent respective fields of view of bottom imaging devices (e.g., another pair of stereoscopic cameras) of the vision simulator 140, in accordance with some embodiments. As discussed, the vision simulator 140 receives the state data 116 (e.g., attitude information of the movable object) from the state simulator 102, and uses computer vision algorithms to determine the visual data 146, the scene data, and the image data 148. The visual data 146, the scene data, and the image data 148 are fed to image rasterization modules to obtain simulated views base on the data determined by the vision simulator 140 and one or more 3-dimensional (or 2-dimensional) graphic models. The simulated views include fields of view from perspectives of one or more imaging sensors borne on the movable object.

The vision simulator 140 provides simulated image data 148 from perspectives of one or more imaging devices borne on the movable object, including but not limited to, a primary imaging device carried by a gimbal system, and/or one or more imaging sensors such as stereoscopic cameras, time-of-flight (TOF) cameras, infrared cameras, a plurality of cameras of a visual odometry (VO) system, and/or ultrasonic imaging sensor. The image data 148 relates to the field(s) of view of the one or more imaging devices based on the positional information of the movable object (e.g., a location and/or attitude information) and/or positional information of the imaging devices (e.g., orientation angles of the primary imaging device). In some examples, the image data 148 includes simulated views of multiple imaging sensors located at different parts of a movable object, such as simulated views (e.g., a pair of stereoscopic images) of two imaging sensors (e.g., a pair of stereoscopic cameras) located at the front of the movable object, and simulated views (e.g., a pair of stereoscopic images) of two imaging sensors (e.g., a pair of stereoscopic cameras) located at the bottom of the movable object. The movable object can also include one or more imaging sensors located at other areas of the movable object, such as left, right, top, and/or back of the movable object. The image data 148 can include simulated views from corresponding imaging sensors, such as left views, right views, up views, and/or back view. In some examples as shown in FIG. 6A, the movable object is located at point 554 in FIG. 6A. A first pyramid of vision 556 having an apex at the point 554 represents a field of view of one or more imaging sensors located at the front of the movable object. As shown in FIG. 6B, the vision simulator 140 can simulate a pair of stereoscopic images 562 and 564 representing views of one or more imaging sensors (e.g., a pair of stereoscopic imaging sensors) located at the front of the movable object. A second pyramid of vision 558 having an apex at the point 554 represents a field of view of one or more imaging sensors located at the bottom of the movable object. As shown in FIG. 6C, the vision simulator 140 can simulate a pair of stereoscopic images 566 and 568 representing views of one or more imaging sensors (a pair of stereoscopic imaging sensors) located at the bottom of the movable object. The image data 148 provided by the vision simulator 140 can include simulated image data from one or more vision sensors and/or the payload, such as the simulated images 562 and 564, and/or simulated images 566 and 568. In some embodiments, the one or more simulated images can be provided as stereoscopic images, separate images, or combined images (e.g., stitched panorama images). In some embodiments, the vision simulator 140 translates the state data from a movable object's coordinate system to an imaging sensor's coordinate system using the positional data of the imaging sensor, such that a first-person-view (FPV) image as shown in FIGS. 6B and 6C can be displayed to the user.

In some embodiments, the scene data includes data associated with the environment surrounding the movable object. In one example, the scene data includes data associated with static objects in the environment, such as mountains, buildings (e.g., buildings in FIG. 6A), trees (e.g., trees in FIG. 6A), etc. In another example, the scene data includes data associated with moving objects in the environment, such as moving people, cars (e.g., cars in FIG. 6A), hot balloons, etc. In some embodiments, the scene data includes 3-dimensional data of 3-dimensional environment surrounding the movable object. In some embodiments, the scene data includes data related to weather condition in the environment.

Using computer vision algorithms, the vision simulator 140 can generate the visual data 146 associated with one or more visualized states of the movable object. Examples of such visualization of the simulated states include a collision with an object in the environment, the movable object flying at a certain height, a torque generated from a collision, a snap of a wing, a force applied to the movable object by the wind, etc.

In some embodiments, the simulated image 600 is displayed on a user interface of an application that operates on an electronic device. The user can view and have direct user interaction through the user interface of the application during the simulation of an operation of the movable object. For example, a user can use the application to control the movable object and to view the simulated views from perspectives of the movable object and/or imaging sensors borne on the movable object. In some examples as shown in FIG. 6A, in addition to the simulated image 600, one or more data items associated with simulated states of the movable object, a simulated environment surrounding the movable object, and/or simulated sensor measurements are displayed, e.g., in real time of the simulation, in a panel 560 on the user interface. For example, the panel 560 lists one or more data items selected from the visual data 146, the scene data, and/or the image data 148 determined by the vision simulator 140. Alternatively or additionally, the panel 560 lists one or more data items selected from the state data 116, the environment data 204, and/or the sensor data 118. For example, as shown in FIG. 6A, the panel 560 lists a speed (i.e., velocity), an orientation angle, a latitude (La), a longitude (Lo), a height (H), and a wind speed (Wind) during the simulation of an operation of the movable object. In some other examples, the panel 560 lists dimensions and/or distances of one or more objects (e.g., a tree) detected in the simulated views. In some embodiments, the user can directly adjust and/or input a number for a data item, such as a height. In response, the corresponding state, e.g., the height, will be changed during the simulation of the movable object. In some embodiments, the user can directly interact with the simulated image to manipulate the simulation of the movable object. For example, the user can circle an object displayed on the simulated view 600, and in response, the vision simulator can display the dimension and/or the distance of the selected object. Additionally or alternatively, the movable object simulation system 100 can generate commands to control the movable object to track or avoid the selected object during the simulation.

Figure 6D:
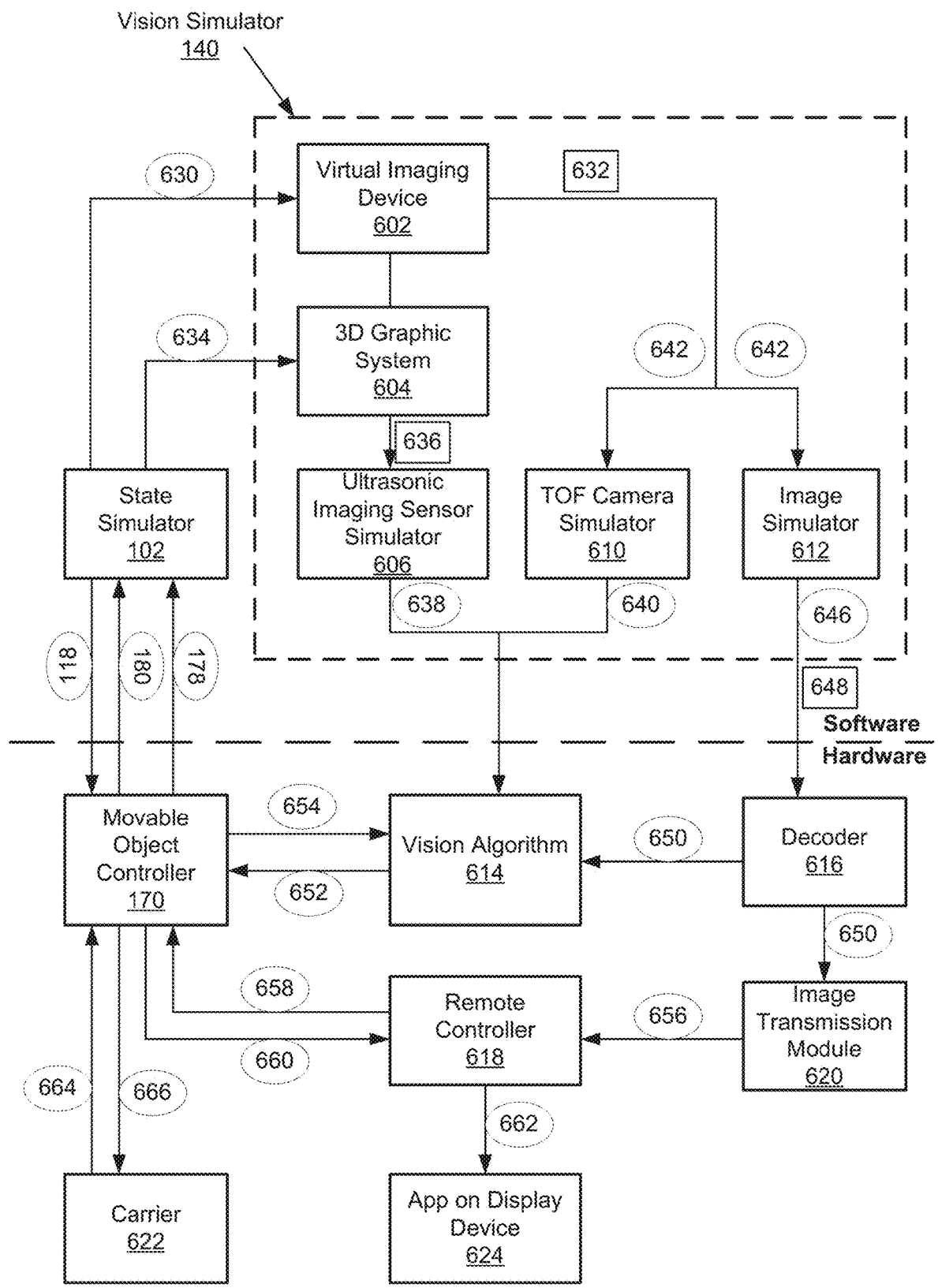
FIG. 6D illustrates a diagram including a plurality of hardware modules and software modules of an exemplary movable object simulation system, in accordance with some embodiments.
Figure 7D:
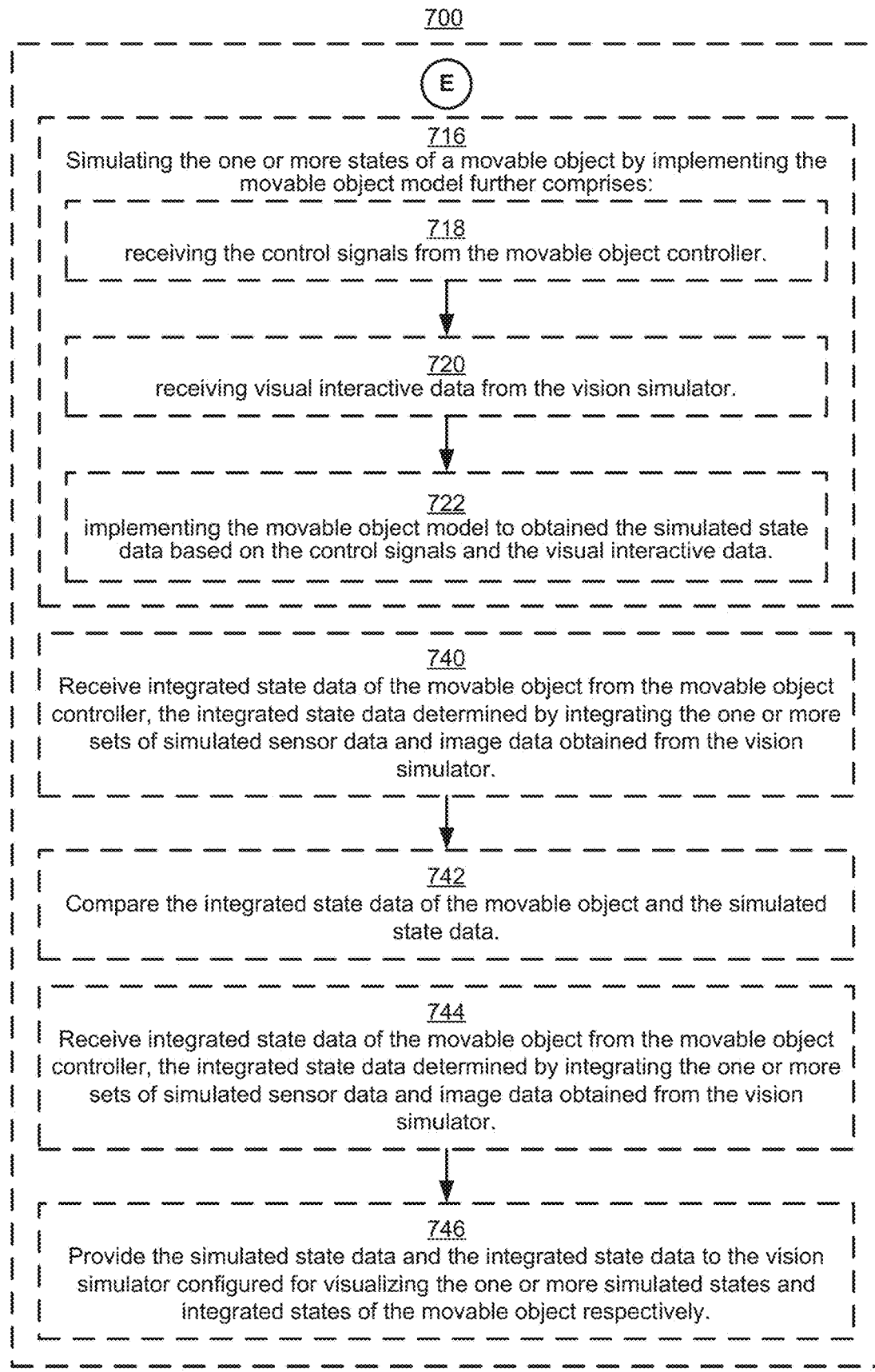

FIG. 6D illustrates a diagram including a plurality of hardware modules and software modules of an exemplary movable object simulation system (e.g., the movable object simulation system 100). The movable object simulation system 100 includes an exemplary vision simulator (e.g., the vision simulator 140). In some embodiments, the vision simulator 140 includes a virtual imaging system 602 for simulating image data of one or more imaging sensors borne on the movable object, a 3-dimensional graphics system 604 for simulating a 3-dimensional environment within which the movable object is operated, an ultrasonic imaging sensor simulator 606 for simulating data from an ultrasonic imaging sensor borne on the movable object, a time-of-flight (TOF) camera simulator 610 for simulating data from a TOF camera borne on the movable object, an image simulator 612 for simulating image data from a primary imaging device/a main imaging device/a payload. In some embodiment, the vision simulator 140 is implemented by a single computing device, while in other embodiments, the vision simulator 140 is implemented by multiple computing devices working together to perform the related actions. In some embodiments, one or more parts of the functionalities of the vision simulator 140 are implemented via cloud computing. In some embodiments, the state simulator 102 and the vision simulator 140 are implemented on the same computing device. Alternatively, the state simulator 102 and the vision simulator 140 are implemented on separate computing devices.

As shown in FIG. 6D, in some embodiments, the state simulator 102 can obtain control signals 180 from the movable object controller 170. The control signals 180 include control signals for adjusting the position of the movable object and the position of the one or more imaging sensors borne on the movable object. In some examples, the control signals 180 include commands for adjusting one or more intrinsic parameters of the one or more imaging sensors, such as focal length, zooming information, depth of focus (DOF), etc. In some examples, the control signals 180 include commands for adjusting extrinsic parameters, such as positional information (e.g., attitude) of the one or more imaging sensors. The position information of the primary imaging device can be changed by adjusting orientation angles of the gimbal along one or more rotational axes. The position information of the imaging sensors, such as stereoscopic cameras and/or depth cameras, can be changed by adjusting positional information of the movable object. In some embodiments, the state simulator 102 can also obtain the integrated data 178 representing the estimated states of the movable object from the movable object controller 170. In some embodiments, the state simulator 102 transmits the sensor data 118 to the movable object controller 170.

As discussed in the present disclosure, the state simulator 102 generates state data 116 (e.g., as discussed with reference to FIGS. 1, 2, and 3), and transmits the state data 116 to the vision simulator 140. The state data 116 can include, but is not limited to, camera data 630 (e.g., orientations of a carrier system) and data 634 (e.g., state information of the movable object).

In some embodiments, the virtual imaging system 602 obtains the camera data 630 from the state simulator 102. The camera data 630 can provide intrinsic parameters and/or extrinsic parameters of one or more imaging sensors/imaging devices based on the control signals 180. The virtual imaging system 602 can rasterize (632) raw image data from one or more virtual imaging sensors/imaging devices to obtain the rasterized image data 642, which can be transmitted to the image simulator 612 and the TOF camera simulator 610. The rasterization process 632 can include taking an image represented in a vector graphics format (shapes) and converting the image into a raster image (pixels or dots) for output on a video display or printer, or for storage in a bitmap file format. In some embodiments, the rasterized image data 642 includes image data from field(s) of view of one or more imaging sensors/imaging devices simulated by the virtual imaging system 602. In some embodiments, the rasterized image data 642 is determined based on the state data 116 determined by the state simulator 102. In some embodiments, the rasterized image data 642 is determined based on the integrated data 178 representing the estimated states of the movable object and determined by the movable object controller 170. In some embodiments, the rasterized image data 642 corresponds to simulated views representing the motion of the movable object and the surrounding environment (e.g., as shown in FIG. 6A). In some embodiments, the rasterized image data 642 is translated from the movable object coordinate system to a coordinate system of the corresponding imaging device (e.g., a primary imaging device, or a pair of stereoscopic imaging sensors located at the front, back, bottom, top, left, or right of the movable object) based on the camera data 630. As such, a first-person-view (FPV) can be provided from a perspective of the imaging device as shown in FIGS. 6B-6C. The rasterization process 632 may be performed using a graphic processing unit (GPU).

In some embodiments, the state simulator 102 can further transmit data 634 to the 3-dimensional graphics system 604 for determining the 3-D dimensional image data related to the environment within which the movable object is operated. In some embodiments, the data 634 is determined based on the environment data 204 and the sensor data 118, which are determined by the environment models 108 and the sensor models 106 respectively. The data 634 may include, but is not limited to, state information of the movable object, including but not limited to, a position, an orientation, an acceleration, a height (also referred to an altitude), a latitude, a longitude, a time, and the Earth's magnetic field strength at a location where the movable is located. In some embodiments, the data 634 is determined based on the sensor data 118 including simulated measurements from the GPS receiver model, the IMU model, and one or more other types of sensor models.

The 3-dimensional graphics system 604 can simulate a 3-dimensional environment based on the data 634. The 3-dimensional graphics system 604 transmits the data (e.g., including the simulated 3-dimensional environment data) to the ultrasonic imaging sensor simulator 606, which is used for estimating an altitude of the movable object relative to the ground during the simulated operation.

The ultrasonic imaging sensor simulator 606 can determine the altitude data 638 based on a simulated ray-casting method (636). For example, ultrasound waves are simulated to be generated from a location where the ultrasonic sensors are located on the movable object, and transmitted towards the ground. In the simulated 3-dimensional environment, the intersections between the casted ultrasound waves and the ground are determined. A distance between an intersection and the initial transmitting point of an ultrasound wave is determined to be altitude data 638 of the movable object (also referred to as simulated image data from an ultrasonic imaging sensor).

As discussed above, in some embodiments, the TOF camera simulator 610 obtains the rasterized image data 642 from the virtual imaging system 602. The TOF camera simulator 610 can process the rasterized image data 642 to obtain depth data 640 of the pixels in the rasterized image (the depth data also referred to as simulated image data from TOF cameras).

In some embodiments, the image simulator 612 receives the rasterized image data 642 and can generate the simulated image data 646 based on the rasterized image data 642. In some embodiments, the rasterized image data 642 is based on the raw image data, and the rasterized image data 642 has raw image data format, e.g., with raw RGB values. In some embodiments, the image simulator 612 processes the raw image data by adding image defects, such as noises, distortions, and/or overexposure or underexposure. The simulated image data 646 may be simulated image data from a field of view of a primary imaging device (e.g., a main imaging device) borne on the movable object. In some embodiments, the simulated image data 646 includes processed data, such as encoded data, which has reduced file size compared to the raw data to provide efficient data transmission, e.g., real-time transmission. The simulated image data from an ultrasonic imaging sensor (e.g., the altitude data 638), the simulated image data from TOF cameras (e.g., the depth data 640), and the simulated image data 646 from a primary imaging device are respective simulated image data from different sensors/imaging sensors/imaging devices with different settings, such as types, resolutions, focal lengths, positions/orientations. As such, the corresponding output simulated image data can be different from different sensors/imaging sensors/imaging devices. In some embodiments, the GPU for rasterizing and simulating the image data at the image simulator 612 can encode (648) the simulated image data 646 for compression. The encoded image data can be transmitted to the decoder 616. The compression process can increase the transmission efficiency of the image data to minimize delay in image data transmission. In some embodiments, the encoded image data may be transmitted to the decoder 616 via a USB communication interface. The decoder 616 decodes the received image data and transmits the decoded image data 650 to the computing device/module on which the computer vision algorithm 614 runs for processing.

In some embodiments, a computing device/a module of a computing device on which the computer vision algorithm 614 runs can receive the altitude data 638 and the depth data 640. The computer vision algorithm 614 can be used to integrate the altitude data 638 and the depth data 640. The computing device on which the computer vision algorithm 614 runs can receive the altitude data 638 and the depth data 640 via a USB communication interface. In some embodiments, the transmission frequency of the altitude data 638 and/or the depth data 640 during simulation is selected to be the same as a sampling rate of a real TOF sensor. As shown in FIG. 6D, the computer vision algorithm 614 can receive the decoded image data from the decoder 616. The computer vision algorithm 614 can further receive control signals 654 related to controlling positional information of the IMU sensors from the movable object controller 170 may send. In some embodiments, the vision algorithm 614 can be any algorithm based at least in part on computer vision, obstacle detection/avoidance, automatic landing, localization, navigation control, path planning, and/or the like. The vision computer algorithm 614 can be used to process the image data 650 from the decoder 616 and/or the integrated data based on the altitude data 638 and the depth data 640 to output control signals 652. In some embodiments, the vision algorithm is any algorithm based at least in part on computer vision, obstacle detection/avoidance, automatic landing, localization, navigation control, path planning, and/or other suitable algorithms. The control signals 652 can include commands to adjust a position of the movable object to avoid an obstacle detected in the simulated image. In some other examples, the control signals 652 can include commands to adjust a location and a velocity of the movable object to track a target in the simulated image.

As shown in FIG. 6D, the image transmission module 620 can obtain the image data 650 from the decoder 616. The image transmission module 620 can transmit image data 656 to the remote controller 618. In some embodiments, the image data 650 to be transmitted to the vision algorithm 614 has lower resolution than the image data 656 to be transmitted to the remote controller 618, because the vision algorithm 614 can process data with lower resolution than the data used for displaying on a display device. In some examples, the image transmission module 620 can transmit the image data 656 as identical to the image data 650 as received. In other examples, the image transmission module 620 can adapt the image data 656 for display on the remote controller 618, and/or other suitable display devices (e.g., by an application 624). In yet another example, the image transmission module 620 can process the image data 650 (e.g., compress or encode) for efficient transmission (e.g., with smaller size, less resolution, etc.).

In some embodiments, a display device of the remote controller 618 can display images based on the image data 656. In some embodiments, the remote controller 618 can receive state information 660 from the movable object controller 170. In some embodiments, the state information 660 can include the sensor data 118 determined by the state simulator 102 and transmitted to the movable object controller 170. In some examples, the state information 660 may be identical to or at least a subset of the integrated data 178 (related to estimated state of the movable object) generated by the movable object controller 170 as discussed with reference to FIG. 1. For example, the state information 660 can include an altitude, a velocity, an orientation, a position, and/or the like of the movable object.

The remote controller 618 can generate and send control signals 658 to the movable object controller 170. The control signals 658 can be generated based on manual operations from a user of the remote controller 618. The remote controller 618 can further transmit data 662 to an application 624 running on a computing device (e.g., a portable electronic device). The data 662 can include the state information 660 and/or the image data 656. For example, the data 662 can include (1) one or more data items of the integrated data 178 determined by the movable object controller 170; (2) one or more data items of the state data 116 determined by the state simulator 102; (3) one or more data items of the sensor data 118; (4) one or more data items of the environment data 204, or (5) any combinations of (1)-(4). In some embodiments, a user interface, e.g., as shown in FIG. 6A is displayed on a display device to the user. For example, the simulated operation of the movable object, the simulated field of view of one or more imaging devices/imaging sensors, and/or the simulated environment can be displayed on the user interface of the application as discussed with reference to FIGS. 6A-6C.

In some embodiments, the movable object controller 170 sends data 666 of the movable object to a carrier 622 (e.g., a gimbal system) configured for carrying a payload (e.g., an imaging device). In some examples, a controller of the carrier 622 can determine position data of the carrier 622 based on the data 666 such that the stabilized fields of view can be maintained when the carrier 622 is in the determined positions. The data 666 can include a position and/or an orientation of the movable object. For example, if the movable object tilts up, the carrier may tilt the imaging device down accordingly to maintain a stabilized field of view. In some embodiments, the data 666 can include at least a subset of the integrated data 178. The carrier 622 may send the determined position data, such as attitude information, as feedback data 664 to the movable object controller 170.

One or more hardware modules can be tested using the hardware-in-the-loop (HIL) simulation system as discussed in the present disclosure. The one or more hardware modules being tested include modules onboard the movable object (e.g., one or more imaging sensors) and/or off-board the movable object (e.g., the remote controller 618, and/or the application 624 on a portable device).

In one example, the remote controller 618 can receive and process the state information 660 and the image data 656 from the movable object controller 170 and the image transmission module 620 respectively. The remote controller 618 can output the data 662 and the control signals 658. The control signals 658 can be transmitted to the movable object controller 170 and the controlling instructions (e.g., the control signals 180) will be updated accordingly. As discussed in the present disclosure, the updated control signals 180 will be fed to the movable object model 104 to output updated state data 116. As such, an instruction sent from the remote controller 618 can effectuate certain changes to a state (e.g., velocity, position, orientation, altitude, etc.) of the movable object, so as to test whether the remote controller 618 can function properly. The remote controller 618 can also transmit the data 662 to the application 624 for display on a computing device. The user can view the operation of the movable object in real time and interact with the simulated operation using the application 624 on a display of the computing device.

In another example, the image transmission module 620 may transmit, adapt, and/or compress the image data 650 to output the image data 656. One or more data items of the image data 656 can be included in the data 662 for display by the application 624 on the computing device, so as to enable the user to view the images/videos on the display to monitor the simulated operation of the movable object. The image transmission module 620 can be effectively tested using the hardware-in-the-loop (HIL) simulation system.

In yet another example, the control of the carrier 622 can also be tested. The controller of the carrier 622 can adjust the orientation of the carrier 622 based on the data 666 (e.g., a position and/or an orientation of the movable object) to maintain a stabilized field of view of the camera payload. As the carrier 622 changes its orientation, the carrier 622 sends the feedback data 664 (e.g., including the updated orientation data) to the movable object controller 170. The movable object controller 170 can update the PWM signals, and accordingly, the ESC interface 176 can output updated control signals 180 based on the updated PWM signals. The state simulator 102 then updates the state data 116 based on the updated control signals. The visual data 146, the image data 148, the camera data 630, and/or the data 634 will also be updated based on the changes to the state data 116. The changes to those types of data can be visualized on the display of the computing device. As such, the control of the carrier 622 can be effectively tested using the hardware-in-the-loop (HIL) simulation system.

FIGS. 7A-7D are a flow diagram illustrating a method 700 for determining state data by the state simulator 102 of the movable object simulation system 100, in accordance with some embodiments. The method 700 is performed at one or more computing devices configured for implementing the state simulator 102. Operations performed in FIGS. 7A-7D correspond to instructions stored in computer memories or other computer-readable storage mediums of the corresponding device(s).

The computing device(s) simulates (702) one or more states of a movable object by implementing a movable object model (e.g., the movable object model 104, FIGS. 1-2). Each simulated state is associated with simulated state data (e.g., the state data 116, or the ground truth data) of the movable object.

In some embodiments, the movable object model is used for simulating an unmanned aerial vehicle (UAV) (e.g., a copter). For example, the movable object model is (712) used for simulating a four-axis X-wing copter, a six-axis X-wing copter, or an eight-axis X-wing copter. In some embodiments, the movable object model comprises (714) a DC motor model (e.g., the BLDC motor model 302, FIG. 3) and a movable object body model (e.g., body model 304, FIG. 3) for determining the simulated state data (e.g., the state data 116).

In some embodiments, the one or more simulated states comprise (724) mechanical failures of a propulsion system of the movable object (e.g., such as a wing breakage), failures of one or more sensors associated with the movable object, changes in the Earth's magnetic field, a collision between the movable object and another object, an obstacle avoidance, a target detection, and/or a target tracking.

In some embodiments, the simulated state data of the movable object comprises (726) a displacement, a velocity, an acceleration, an attitude, an angular velocity, an angular acceleration, a longitude, a latitude, and/or a height of the movable object (e.g., as discussed with reference to FIG. 3).

The computing device(s) determine (704) one or more sets of simulated sensor data (e.g., the sensor data 118) corresponding to the one or more simulated states respectively by implementing a plurality of sensor models (e.g., the sensor models 106, FIGS. 5A-5E).

In some embodiments, determining the one or more sets of simulated sensor data by implementing the plurality of sensor models further comprises (728) integrating the simulated state data (e.g., the state data 116) and the environment data (e.g., the environment data 204) to obtain the one or more sets of simulated sensor data.

In some embodiments, the plurality of sensor models are used (730) for obtaining simulated sensor data of an accelerometer, a gyroscope, a magnetometer, a GPS receiver, an ultrasonic sensor, a thermometer, and/or a barometer that are associated with the movable object (e.g., as discussed with reference to FIGS. 5A-5E).

The computing device(s) determines (706) environment data (e.g., the environment data 204, FIG. 2) of a simulated environment surrounding the movable object by implementing an environment model (e.g., the one or more environment models 108, FIGS. 4A-4C).

In some embodiments, the environment data comprises (732) an Earth's magnetic field strength (e.g., FIG. 4A) calculated based on the simulated state data comprising a longitude, a latitude, a height, and a time of the movable object. In some embodiments, the environment data comprises (734) an air pressure and an ambient temperature (e.g., FIG. 4B) calculated based on a simulated height of the movable object. In some embodiments, the environment data comprises (736) a magnetic disturbance (e.g., FIG. 4C) to the movable object calculated based on a location, a shape, and a current intensity of an Earth's magnetosphere disturbance at a simulated location of the movable object.

The computing device(s) provides (708) the one or more sets of simulated sensor data to a movable object controller (e.g., the movable object controller 170, FIG. 1) configured for generating control signals (e.g., the control signals 180, FIG. 1) to adjust states of the movable object (e.g., by controlling one or more motors of the movable object). In some embodiments, the control signals 180 include three-phase (or AC) electric power including low voltage source that is used for controlling the motors. In some embodiments, the control signals are generated (738) based on the Pulse-width modulation (PWM) signals.

The computing device(s) provides (710) the simulated state data (e.g., the state data 116) and the environment data (e.g., the environment data 204) to a vision simulator (e.g., the vision simulator 140) configured for visualizing operations of the movable object in the one or more simulated states.

In some embodiments, the simulating the one or more states of a movable object by implementing the movable object model further comprises (716): receiving (718) the control signals from the movable object controller; receiving (720) visual interactive data (e.g., the visual data 146) from the vision simulator; and implementing (722) the movable object model to obtain the simulated state data based on the control signals and the visual interactive data.

In some embodiments, the computing device(s) receives (740) integrated state data (e.g., the integrated data 178, FIG. 1) of the movable object from the movable object controller. The integrated state data is determined by integrating the one or more sets of simulated sensor data (e.g., the sensor data 118) and image data (e.g., the image data 148) obtained from the vision simulator. In some embodiments, the computing device(s) compares (742) the integrated state data (e.g., the integrated data 178) of the movable object and the simulated state data (e.g., the state data 116) for verifying the algorithms at the movable object controller.

In some embodiments, the computing device(s) receives (744) integrated state data (e.g., the integrated data 178) of the movable object from the movable object controller. The integrated state data determined by integrating the one or more sets of simulated sensor data (e.g., the sensor data 118) and image data (e.g., the image data 148) obtained from the vision simulator. In some embodiments, the computing device(s) provides (746) the simulated state data (e.g., the state data 116) and the integrated state data (e.g., the integrated data 178) to the vision simulator configured for visualizing the one or more simulated states and integrated states of the movable object respectively.

Figure 8A:
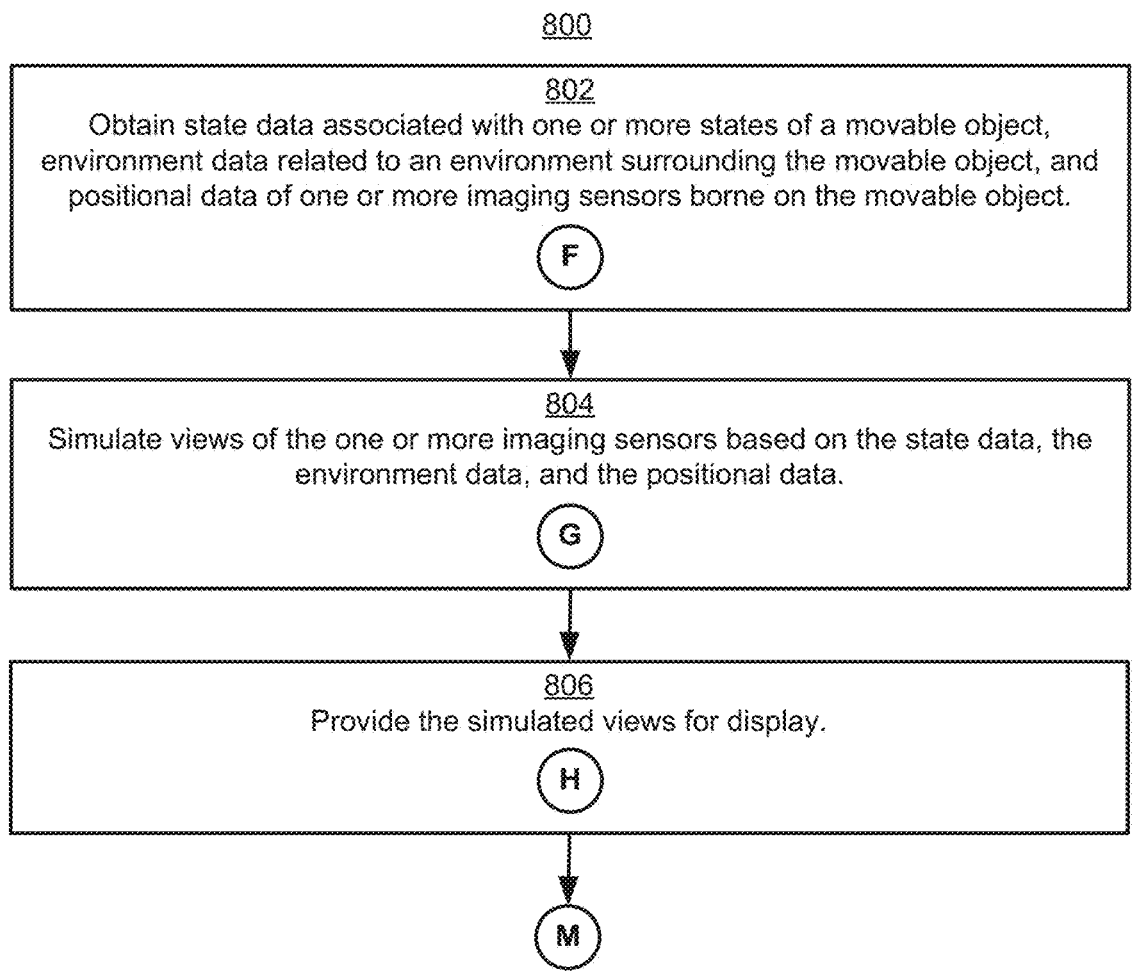
Figure 8A:
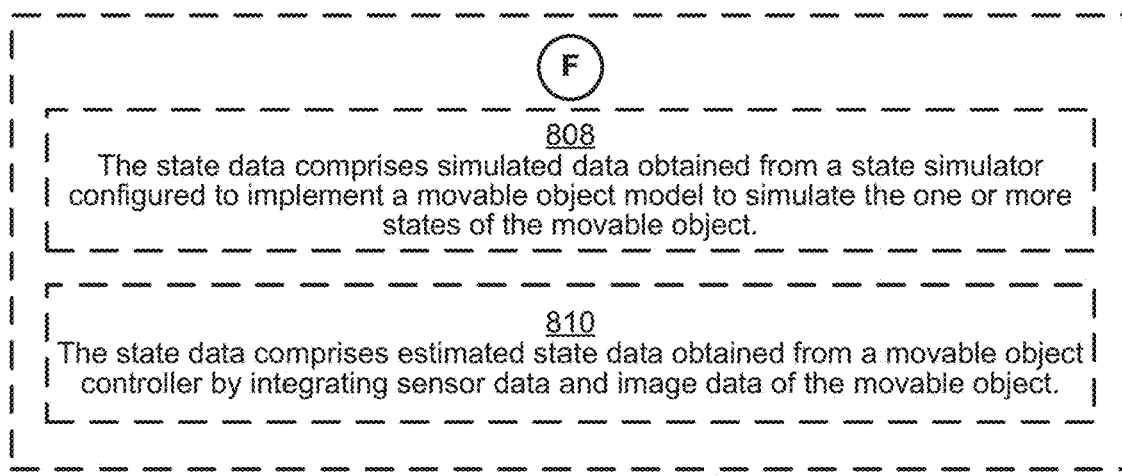
Figure 8C:
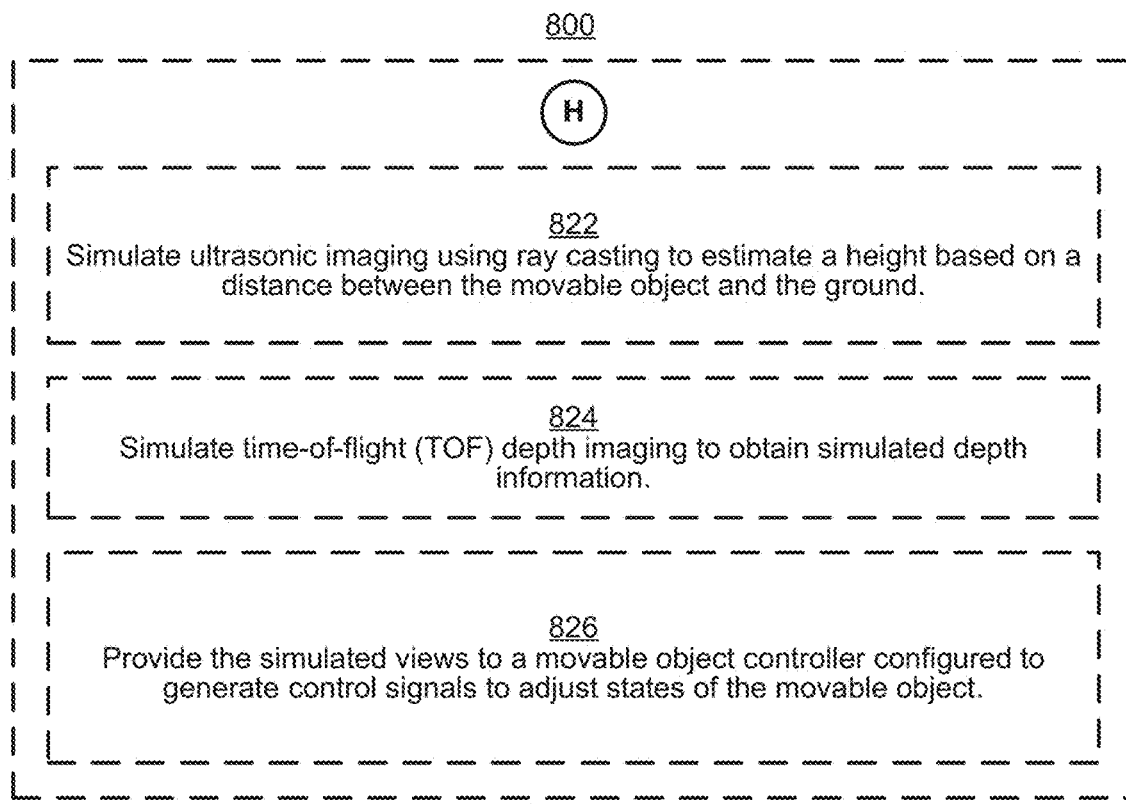

FIGS. 8A-8C are a flow diagram illustrating a method performed by a vision simulator (e.g., the vision simulator 140) of a movable object simulation system (e.g., the movable object simulation system 100), in accordance with some embodiments. The method 800 is performed at one or more computing devices configured for implementing the vision simulator 104. Operations performed in FIGS. 8A-8C correspond to instructions stored in computer memories or other computer-readable storage mediums of the corresponding device(s).

The computing device(s) obtain (802) state data associated with one or more states of a movable object, environment data (e.g., the environment data 204) related to an environment surrounding the movable object, and positional data (e.g., the camera data 630) of one or more imaging sensors borne on the movable object. In some embodiments, the state data comprises (808) simulated data (e.g., the state data 116) obtained from a state simulator (e.g., the state simulator 102) configured to implement a movable object model to simulate the one or more states of the movable object. In some embodiments, the state data comprises (810) estimated state data (e.g., the integrated data 178) obtained from a movable object controller (e.g., the movable object controller 170) by integrating sensor data and image data of the movable object.

The computing device(s) simulate (804) views of the one or more imaging sensors based on the state data, the environment data, and the positional data. In some embodiments, simulating views of the one or more imaging sensors further comprises (812) translating the state data from a movable object's coordinate system to the imaging sensors' coordinate system using the positional data (e.g., the camera data 630) of the imaging sensor. In some embodiments, the simulated views comprise (814) 3-dimensional images, as shown in FIGS. 6A-6C. In some embodiments, the one or more imaging sensors comprise (816) an imaging device (e.g., a primary imaging device) supported by a carrier (e.g., a gimbal system) borne on the movable object or a plurality of cameras of a visual odometry system.

The computing device(s) provide (806) the simulated views for display. In some embodiments, the computing device(s) simulate (822) ultrasonic imaging using ray casting (e.g., the ultrasonic imaging sensor simulator 606, FIG. 6D) to estimate a height (e.g., an altitude) based on a distance between the movable object and the ground. In some embodiments, the computing device(s) simulate (824) time-of-flight (TOF) depth imaging (e.g., the TOF camera simulator 610, FIG. 6D) to obtain simulated depth information. In some embodiments, the computing device(s) provide (826) the simulated views (e.g., the image data 148 and/or the visual data 146) to a movable object controller (e.g., the movable object controller 170) configured to generate control signals to adjust states of the movable object.

In some embodiments, providing the simulated views for display comprises (818) sending the simulated views (e.g., the image data 656) to a remote controller (e.g., the remote controller 618) for display. In some embodiments, providing the simulated views for display comprises (820) sending the simulated views (e.g., the data 662) to an application (e.g., the application 624) running on a portable device for display.

Figure 9A:
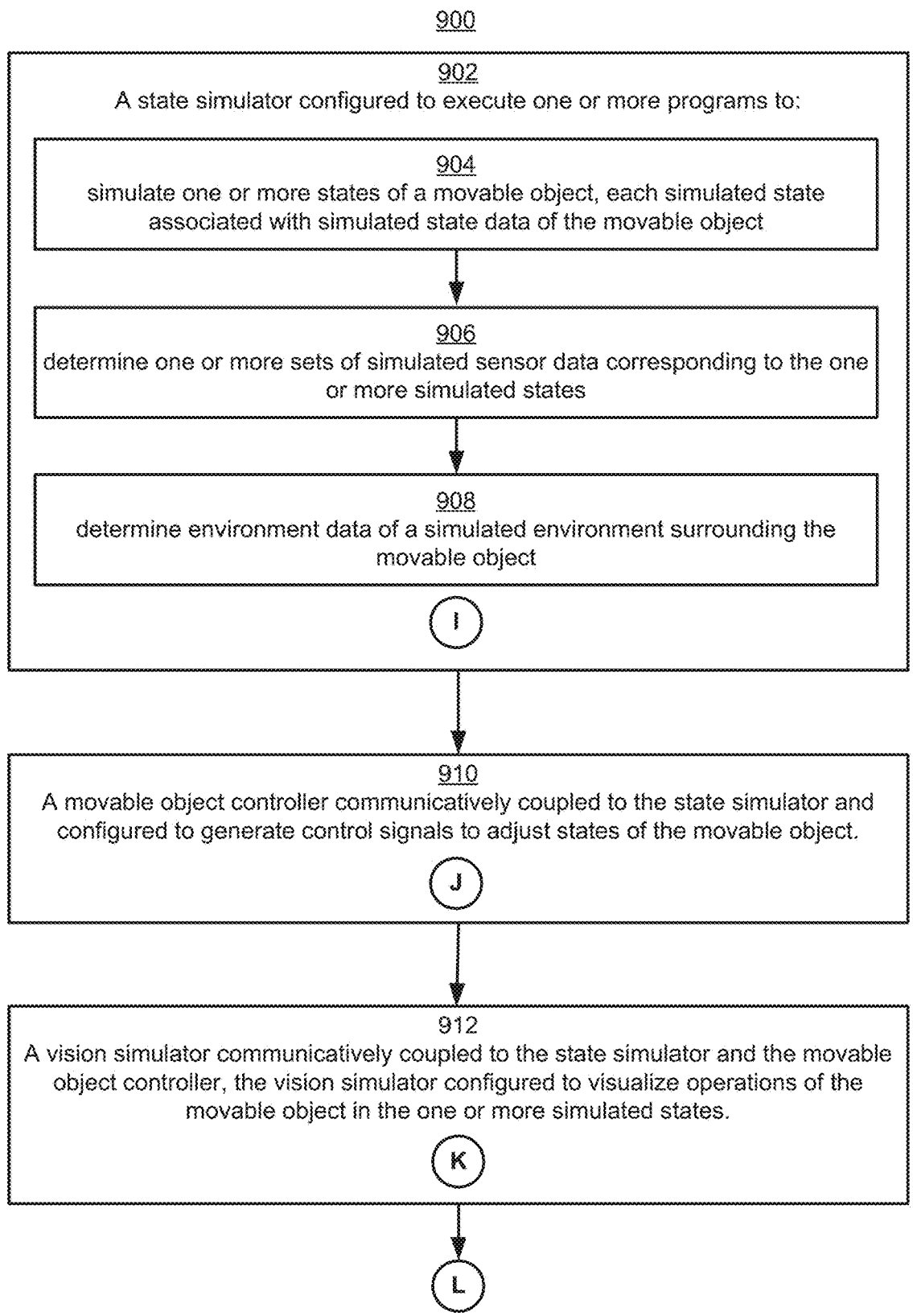
FIGS. 9A-9C are flow diagrams illustrating a movable object simulation system, in accordance with some embodiments.
Figure 9B:
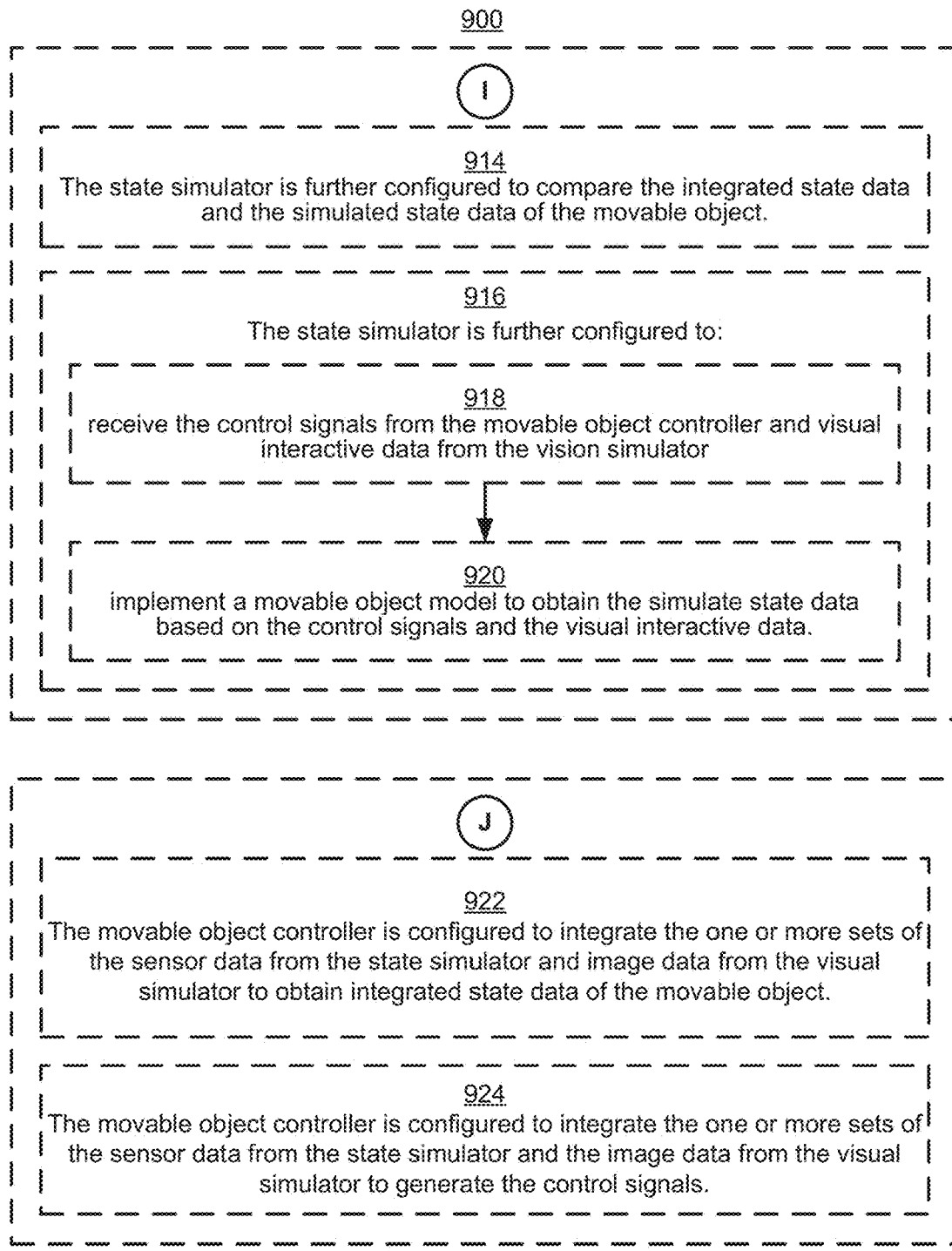
Figure 9C:
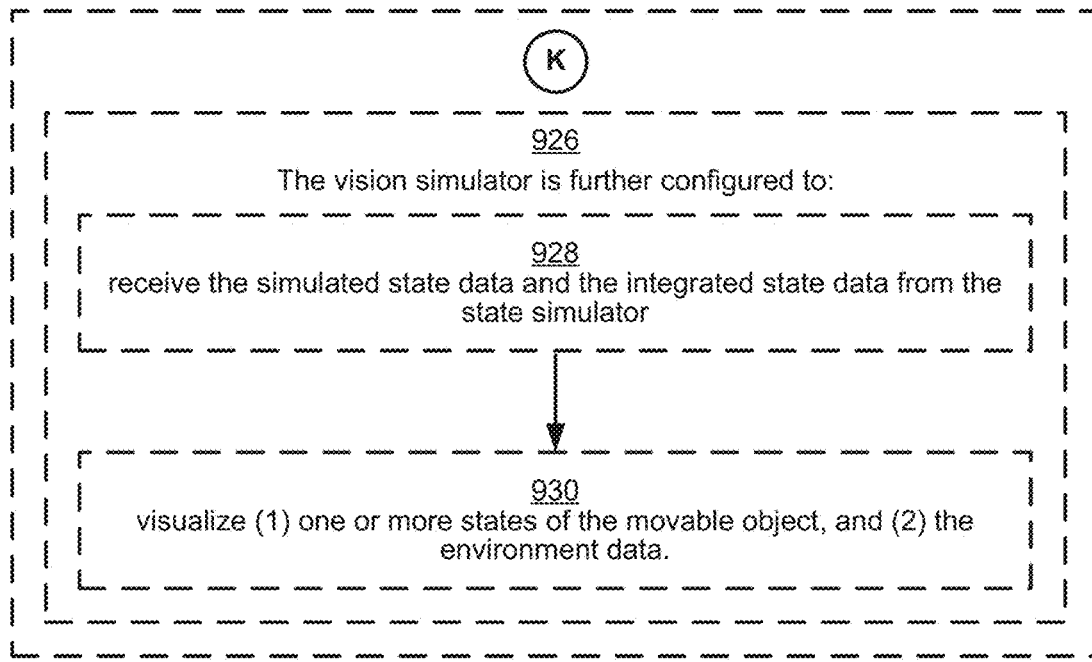
Figure 9C:
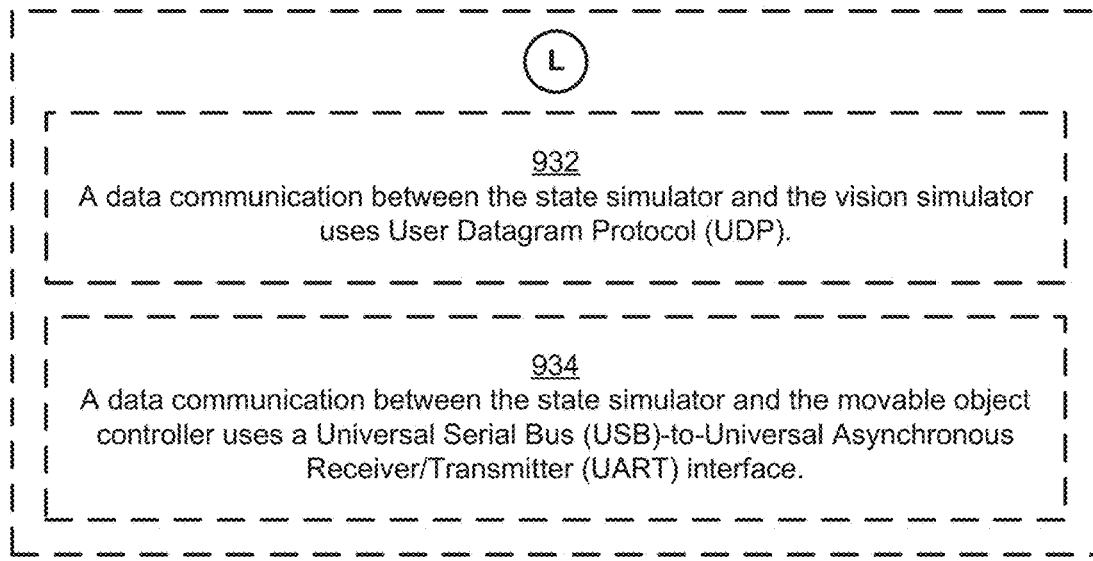

FIGS. 9A-9C are a flow diagram illustrating a movable object simulation system 900 (e.g., the movable object system 100, FIG. 1), in accordance with some embodiments. The movable object simulation system comprises (902) a state simulator (e.g., the state simulator 102, FIG. 1) configured to execute one or more programs to simulate (904) one or more states of a movable object. Each simulated state is associated with simulated state data (e.g., the state data 116) of the movable object. The state simulator (e.g., the state simulator 102, FIG. 1) is further configured to execute one or more programs to determine (906) one or more sets of simulated sensor data (e.g., the sensor data 118) corresponding to the one or more simulated states. The state simulator (e.g., the state simulator 102, FIG. 1) is further configured to execute one or more programs to determine (908) environment data (e.g., the environment data 204) of a simulated environment surrounding the movable object.

In some embodiments, the state simulator is further configured to compare (914) the integrated state data (e.g., the integrated data 178) and the simulated state data (e.g., the state data 116) of the movable object. In some embodiments, the state simulator is (916) further configured to receive (918) the control signals (e.g., the control signals 180) from the movable object controller (e.g., the movable object controller 170) and visual interactive data (e.g., the visual data 146) from the vision simulator (e.g., the vision simulator 140). In some embodiments, the state simulator is also configured to implement (920) a movable object model (e.g., the movable object model 104) to obtain the simulate state data based on the control signals and the visual interactive data.

The movable object simulation system further comprises (910) a movable object controller (e.g., the movable object controller 170, FIG. 1) communicatively coupled to the state simulator and configured to generate control signals (e.g., the control signals 180) to adjust states of the movable object.

In some embodiments, the movable object controller is configured to integrate (922) the one or more sets of the sensor data (e.g., the sensor data 118) from the state simulator and image data (e.g., the image data 148) from the vision simulator to obtain integrated state data (e.g., the integrated data 178) of the movable object.

In some embodiments, the movable object controller is configured to integrate (924) the one or more sets of the sensor data (e.g., the sensor data 118) from the state simulator and the image data (e.g., the image data 148) from the visual simulator to generate the PWM signals, which are further used to generate control signals (e.g., the control signals 180) by the ESC interface 176 of the movable object controller 170.

The movable object simulation system further comprises (912) a vision simulator (e.g., the visional simulator 140, FIG. 1) communicatively coupled to the state simulator and the movable object controller. The vision simulator is configured to visualize operations of the movable object in the one or more simulated states.

In some embodiments, the vision simulator is (926) configured to receive (928) the simulated state data (e.g., the state data 116) and the integrated state data (e.g., the integrated data 178) from the state simulator. The vision simulator is also configured to visualize (930) (1) one or more states of the movable object, and (2) the environment data (e.g., FIGS. 6A-6C).

In some embodiments, a data communication between the state simulator and the vision simulator uses User Datagram Protocol (UDP) (e.g., the UDP interface 110). In some embodiments, a data communication between the state simulator and the movable object controller uses a Universal Serial Bus (USB)-to-Universal Asynchronous Receiver/Transmitter (UART) interface (e.g., The USB interface 112, the USB-to-UART converter 113, and the UART interface 172).

Many features of the present disclosure can be performed in, using, or with the assistance of hardware, software, firmware, or combinations thereof. Consequently, features of the present disclosure may be implemented using a processing system. Exemplary processing systems (e.g., processor(s) the one or more computing devices) include, without limitation, one or more general purpose microprocessors (for example, single or multi-core processors), application-specific integrated circuits, application-specific instruction-set processors, field-programmable gate arrays, graphics processors, physics processors, digital signal processors, coprocessors, network processors, audio processors, encryption processors, and the like.

Features of the present disclosure can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, DDR RAMs, flash memory devices, magnetic or optical cards, nanosystems (including molecular memory ICs), or any type of media or device suitable for storing instructions and/or data.

Stored on any one of the machine readable medium (media), features of the present disclosure can be incorporated in software and/or firmware for controlling the hardware of a processing system, and for enabling a processing system to interact with other mechanism utilizing the results of the present disclosure. Such software or firmware may include, but is not limited to, application code, device drivers, operating systems, and execution environments/containers.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications that are suited to the particular use contemplated. It is intended that the scope of the invention be defined by the following claims and their equivalence.

The present disclosure has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the disclosure.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined ⌊ that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A method, comprising:
   simulating, by implementing a movable object model, one or more states of a movable object, each simulated state associated with simulated state data of the movable object;
   determining, by implementing a plurality of sensor models, one or more sets of simulated sensor data corresponding to the one or more simulated states of the movable object respectively;
   determining, by implementing an environment model, environment data of a simulated environment surrounding the movable object;
   providing the one or more sets of simulated sensor data to a movable object controller configured for generating control signals to adjust states of the movable object;
   providing the simulated state data of the movable object and the environment data to a vision simulator configured for visualizing operations of the movable object in the one or more simulated states of the movable object, wherein visualizing the operations of the movable object includes:
      generating visual data showing the movable object and interactions of the movable object with one or more objects in the simulated environment, the visual data indicating a force applied to the movable object by wind; and
      providing simulated image data from perspectives of one or more imaging devices borne on the movable object;
   receiving integrated state data of the movable object from the movable object controller, the integrated state data determined by integrating the one or more sets of simulated sensor data and the simulated image data obtained from the vision simulator; and
   comparing the integrated state data of the movable object and the simulated state data of the movable object to test and evaluate whether the movable object controller is malfunctioning.

2. The method of claim 1, wherein the movable object model is used for simulating a four-axis X-wing copter, a six-axis X-wing copter, or an eight-axis X-wing copter.

3. The method of claim 1, wherein the movable object model comprises a direct-current (DC) motor model and a movable object body model for determining the simulated state data.

4. The method of claim 1, wherein simulating the one or more states of the movable object by implementing the movable object model comprises:
   receiving the control signals from the movable object controller;
   receiving the visual data from the vision simulator; and
   implementing the movable object model to obtain the simulated state data based on the control signals and the visual data.

5. The method of claim 1, wherein the one or more simulated states comprise at least one of mechanical failures of a propulsion system of the movable object, failures of one or more sensors associated with the movable object, changes in the Earth's magnetic field, a collision between the movable object and another object, an obstacle avoidance, a target detection, or a target tracking.

6. The method of claim 1, wherein the simulated state data of the movable object comprises at least one of a displacement, a velocity, an acceleration, an attitude, an angular velocity, an angular acceleration, a longitude, a latitude, or a height of the movable object.

7. The method of claim 1, wherein determining the one or more sets of simulated sensor data by implementing the plurality of sensor models comprises:
   integrating the simulated state data and the environment data to obtain the one or more sets of simulated sensor data.

8. The method of claim 1, wherein the plurality of sensor models are configured for obtaining simulated sensor data of at least one of an accelerometer associated with the movable object, a gyroscope associated with the movable object, a magnetometer associated with the movable object, a GPS receiver associated with the movable object, an ultrasonic sensor associated with the movable object, a thermometer associated with the movable object, or a barometer associated with the movable object.

9. The method of claim 1, wherein the environment data comprises an Earth's magnetic field strength calculated based on the simulated state data comprising at least one of a longitude, a latitude, a height, or a time of the movable object.

10. The method of claim 1, wherein the environment data comprises at least one of an air pressure or an ambient temperature calculated based on a simulated height of the movable object.

11. The method of claim 1, wherein the environment data comprises a magnetic disturbance to the movable object calculated based on at least one of a location, a shape, or a current intensity of an Earth's magnetosphere disturbance at a simulated location of the movable object.

12. The method of claim 1, further comprising:
   receiving integrated state data of the movable object from the movable object controller, the integrated state data determined by integrating the one or more sets of simulated sensor data and image data obtained from the vision simulator; and performing at least one of:
comparing the integrated state data of the movable object and the simulated state data; or
providing the simulated state data and the integrated state data to the vision simulator configured for visualizing the one or more simulated states and integrated states of the movable object.

13. The method of claim 1, wherein the control signals are generated based on pulse-width modulation (PWM) signals.

14. The method of claim 1, wherein the visual data further indicate a force applied to the movable object during a collision.

15. The method of claim 1, wherein:
providing the one or more sets of simulated sensor data to the movable object controller includes:
providing, through a communication interface of a first type, the one or more sets of simulated sensor data to the movable object controller; and
providing the simulated state data of the movable object and the environment data to the vision simulator includes:
providing, through a communication interface of a second type, the simulated state data and the environment data to the vision simulator, the second type being different from the second type.

16. A system for processing data comprising:
one or more processors; and
a memory storing one or more programs configured to be executed by the one or more processors, the one or more programs including instructions for:
simulating, by implementing a movable object model, one or more states of a movable object, each simulated state associated with simulated state data of the movable object;
determining, by implementing a plurality of sensor models, one or more sets of simulated sensor data corresponding to the one or more simulated states of the movable object respectively;
determining, by implementing an environment model, environment data of a simulated environment surrounding the movable object;
providing the one or more sets of simulated sensor data to a movable object controller configured for generating control signals to adjust states of the movable object;
providing the simulated state data of the movable object and the environment data to a vision simulator configured for visualizing operations of the movable object in the one or more simulated states of the movable object, wherein visualizing the operations of the movable object includes:
generating visual data showing the movable object and interactions of the movable object with one or more objects in the simulated environment, the visual data indicating a force applied to the movable object by wind; and
providing simulated image data from perspectives of one or more imaging devices borne on the movable object;
receiving integrated state data of the movable object from the movable object controller, the integrated state data determined by integrating the one or more sets of simulated sensor data and the simulated image data obtained from the vision simulator; and
comparing the integrated state data of the movable object and the simulated state data of the movable object to test and evaluate whether the movable object controller is malfunctioning.

17. The system of claim 16, wherein the instruction for simulating the one or more states of the movable object by implementing the movable object model comprises instructions for:
receiving the control signals from the movable object controller;
receiving the visual data from the vision simulator; and
implementing the movable object model to obtain the simulated state data based on the control signals and the visual data.

18. The system of claim 16, wherein the instruction for determining the one or more sets of simulated sensor data by implementing the plurality of sensor models comprises instructions for:
integrating the simulated state data and the environment data to obtain the one or more sets of simulated sensor data.

19. A method, comprising:
simulating, by implementing a movable object model, one or more states of a movable object, each simulated state associated with simulated state data of the movable object;
determining, by implementing a plurality of sensor models, one or more sets of simulated sensor data corresponding to the one or more simulated states of the movable object respectively;
determining, by implementing an environment model, environment data of a simulated environment surrounding the movable object;
providing the simulated state data of the movable object and the environment data to a vision simulator configured for visualizing operations of the movable object in the one or more simulated states of the movable object, wherein visualizing the operations of the movable object includes:
generating visual data showing the movable object and interactions of the movable object with one or more objects in the simulated environment; and
providing simulated image data from perspectives of one or more imaging devices borne on the movable object;
providing the one or more sets of simulated sensor data and the simulated image data to a movable object controller configured for generating control signals to adjust states of the movable object, wherein the movable object controller determines an estimated state of the movable object based on the one more sets of simulated sensor data and the simulated image data and generates the control signals based on the estimated state, the estimated state being represented by integrated state data;
receiving the integrated state data from the movable object controller; and
comparing the estimated state with the one or more simulated states by comparing the integrated state data with the simulated state data, to test and evaluate whether the movable object controller is malfunctioning.

* * * * *